US012619146B2

(12) United States Patent
Yoshino et al.

(10) Patent No.: US 12,619,146 B2
(45) Date of Patent: May 5, 2026

(54) ACTINIC-RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Fumihiro Yoshino, Haibara-gun (JP); Takamitsu Tomiga, Haibara-gun (JP); Yuma Kurumisawa, Haibara-gun (JP); Takumi Tanaka, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 596 days.

(21) Appl. No.: 18/158,781

(22) Filed: Jan. 24, 2023

(65) Prior Publication Data

US 2023/0161253 A1 May 25, 2023

Related U.S. Application Data

(63) Continuation of application No. PCT/JP2021/025206, filed on Jul. 2, 2021.

(30) Foreign Application Priority Data

Jul. 29, 2020 (JP) ................................ 2020-128367

(51) Int. Cl.

| | |
|---|---|
| ***G03F 7/039*** | (2006.01) |
| ***C08F 212/14*** | (2006.01) |
| ***C08F 220/18*** | (2006.01) |
| ***G03F 7/038*** | (2006.01) |

(52) U.S. Cl.

CPC ............ *G03F 7/039* (2013.01); *C08F 212/24* (2020.02); *C08F 220/1804* (2020.02); *C08F 220/1806* (2020.02); *G03F 7/038* (2013.01)

(58) Field of Classification Search

CPC ........ G03F 7/039; G03F 7/038; G03F 7/0392; G03F 7/004; G03F 7/033; G03F 7/0382; G03F 7/2004; C08F 212/24; C08F 220/1804; C08F 220/1806; C08F 220/1807; C08F 220/1808; C08F 220/283; C08F 2/50; C08F 265/06; C09D 125/18

USPC ........................ 430/270.1, 311, 271.1, 272.1

See application file for complete search history.

(56) References Cited

U.S. PATENT DOCUMENTS

| | | | |
|---|---|---|---|
| 9,417,527 | B2 | 8/2016 | Katsura et al. |
| 2013/0216948 | A1 | 8/2013 | Kasahara et al. |
| 2015/0048051 | A1 | 2/2015 | Katsura et al. |
| 2018/0246406 | A1 | 8/2018 | Yoshino |
| 2021/0055653 | A1 | 2/2021 | Yoshimura et al. |
| 2023/0194983 | A1 | 6/2023 | Yoshimura et al. |

FOREIGN PATENT DOCUMENTS

| | | | |
|---|---|---|---|
| CN | 111095105 | A | 5/2020 |
| JP | 2002196497 | A | 7/2002 |
| JP | 2002221795 | A | 8/2002 |
| JP | 2010039146 | A | 2/2010 |
| JP | 2010224522 | A | 10/2010 |
| JP | 2015-57638 | A | 3/2015 |
| JP | 2016-133743 | A | 7/2016 |
| KR | 10-2002-0031038 | A | 4/2002 |
| KR | 10-2013-0114110 | A | 10/2013 |
| KR | 10-2015-0020083 | A | 2/2015 |
| TW | 201229660 | A1 | 7/2012 |
| WO | 2012043684 | A1 | 4/2012 |
| WO | 2017078031 | A1 | 5/2017 |

OTHER PUBLICATIONS

Office Action dated Nov. 7, 2024, issued by Taiwanese Patent Office in counterpart Taiwanese Patent Application No. 110127275.
Communication issued by the Japanese Patent Office on Jun. 20, 2023 for Japanese Patent Application No. 2022-540104.
Communication dated Oct. 10, 2024, issued by the Korean Patent Office in Korean Application No. 10-2023-7000846.
International Search Report (PCT/ISA/210) dated Sep. 7, 2021 issued by the International Searching Authority in International Application No. PCT/JP2021/025206.
Written Opinion (PCT/ISA/237) dated Sep. 7, 2021 issued by the International Searching Authority in International Application No. PCT/JP2021/025206.
Office Action dated Jun. 11, 2025, issued by Taiwanese Patent Office in Taiwanese Patent Application No. 110127275.
Office Action issued Mar. 12, 2026 in Chinese Application No. 202180048994.2.

*Primary Examiner* — Caleen O Sullivan
(74) *Attorney, Agent, or Firm* — Sughrue Mion, PLLC

(57) ABSTRACT

An actinic ray-sensitive or radiation-sensitive resin composition contains a resin (A) and a resin (B) which include a repeating unit having an acid-decomposable group, and the acid-decomposable group in the resin (A) and the acid-decomposable group in the resin (B) have the same structures. Regarding the resin (A) and the resin (B), $|G_A-G_B|$ is from 5% by mole to 20% by mole, $S_A/S_B$ is 10/90 to 90/10, $|Mw_A-Mw_B|$ is from 100 to 5,000, and $|Mw_A/Mn_A-Mw_B/Mn_B|$ is 0.05 or more.

13 Claims, No Drawings

ACTINIC-RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

CROSS REFERENCE TO RELATED APPLICATION

This is a continuation of International Application No. PCT/JP2021/025206 filed on Jul. 2, 2021, and claims priority from Japanese Patent Application No. 2020-128367 filed on Jul. 29, 2020, the entire disclosures of which are incorporated herein by reference.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

In processes for manufacturing semiconductor devices such as an integrated circuit (IC) and a large scale integrated circuit (LSI), microfabrication by lithography using an actinic ray-sensitive or radiation-sensitive resin composition has been performed.

Examples of the lithography method include a method of forming a resist film by an actinic ray-sensitive or radiation-sensitive resin composition, and then exposing the obtained resist film, followed by performing development to form a resist pattern.

As the actinic ray-sensitive or radiation-sensitive resin composition, those containing a resin including a repeating unit having an acid-decomposable group (acid-decomposable resin) are known.

In recent years, an actinic ray-sensitive or radiation-sensitive resin composition suitable for forming a pattern using a thick-film resist film has also been proposed (see, for example, WO2017/078031A). A resist composition in which two kinds of resins including a repeating unit having an acid-decomposable group are used in combination is described in WO2017/078031A.

SUMMARY OF THE INVENTION

An actinic ray-sensitive or radiation-sensitive resin composition which has a good sensitivity and is capable of forming a pattern having an excellent cross-sectional shape is disclosed in WO2017/078031A, but according to the studies conducted by the present inventors, it was found that there is room for further improvement in critical dimension uniformity (CDU) exhibiting the uniformity of pattern dimensions in a wafer plane.

An object of the present invention is to form an actinic ray-sensitive or radiation-sensitive resin composition capable of forming a pattern having an excellent CDU, and a resist film, a pattern forming method, and a method for manufacturing an electronic device, each using the actinic ray-sensitive or radiation-sensitive resin composition.

The present inventors have found that the objects can be accomplished by the following configurations.

<1> An actinic ray-sensitive or radiation-sensitive resin composition comprising:

a resin (A) including a repeating unit having an acid-decomposable group; and a resin (B) including a repeating unit having an acid-decomposable group, in which an absolute value $|G_A-G_B|$ of a difference between a mole-based content ratio $G_A$ of the repeating unit having an acid-decomposable group in the resin (A) and a mole-based content ratio $G_B$ of the repeating unit having an acid-decomposable group in the resin (B) is from 5% by mole to 20% by mole, the acid-decomposable group in the resin (A) and the acid-decomposable group in the resin (B) have the same structures, a ratio $S_A/S_B$ between a mass-based content ratio $S_A$ of the resin (A) to a mass-based content ratio $S_B$ of the resin (B) with respect to a total solid content in the actinic ray-sensitive or radiation-sensitive resin composition is 10/90 to 90/10, an absolute value $|Mw_A-Mw_B|$ of a difference between a weight-average molecular weight $Mw_A$ of the resin (A) and a weight-average molecular weight $Mw_B$ of the resin (B) is from 100 to 5,000, and an absolute value $|Mw_A/Mn_A-Mw_B/Mn_B|$ of a difference between a molecular weight distribution $Mw_A/Mn_A$ of the resin (A), which is a value obtained by dividing $Mw_A$ by a number-average molecular weight $Mn_A$ of the resin (A), and a molecular weight distribution $Mw_B/Mn_B$ of the resin (B), which is a value obtained by dividing $Mw_B$ by a number-average molecular weight $Mn_B$ of the resin (B), is 0.05 or more.

<2> The actinic ray-sensitive or radiation-sensitive resin composition as described in <1>, in which the repeating unit having an acid-decomposable group included in the resin (A) and the resin (B) is represented by General Formula (Aa2).

(Aa2)

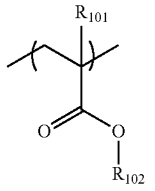

In General Formula (Aa2), $R_{101}$ represents a hydrogen atom, a fluorine atom, an iodine atom, an alkyl group, or an aryl group, and $R_{102}$ represents a group that leaves by an action of an acid.

<3> The actinic ray-sensitive or radiation-sensitive resin composition as described in <1> or <2>, in which $S_A/S_B$ is 40/60 to 60/40.

<4> The actinic ray-sensitive or radiation-sensitive resin composition as described in any one of <1> to <3>, in which a viscosity at 25° C. is 10 to 100 mPa·s.

<5> The actinic ray-sensitive or radiation-sensitive resin composition as described in any one of <1> to <4>, in which $|G_A-G_B|$ is from 10% by mole to 20% by mole.

<6> The actinic ray-sensitive or radiation-sensitive resin composition as described in any one of <1> to <5>, in which $G_A$ is 30% by mole or less.

<7> The actinic ray-sensitive or radiation-sensitive resin composition as described in any one of <1> to <6>, in which $|Mw_A/Mn_A-Mw_B/Mn_B|$ is 0.10 or more.

<8> The actinic ray-sensitive or radiation-sensitive resin composition as described in any one of <1> to <7>, in which $|Mw_A-Mw_B|$ is from 1,000 to 5,000.

<9> The actinic ray-sensitive or radiation-sensitive resin composition as described in any one of <1> to <8>, in which an absolute value $|Mz_A-Mz_B|$ of a difference between a Z-average molecular weight $Mz_A$ of the resin (A) and a Z-average molecular weight $Mz_B$ of the resin (B) is 100 or more.

<10> The actinic ray-sensitive or radiation-sensitive resin composition as described in <9>, in which $|Mz_A-Mz_B|$ is 1,000 or more.

<11> A resist film formed of the actinic ray-sensitive or radiation-sensitive resin composition as described in any one of <1> to <10>.

<12> A pattern forming method comprising:

a step of forming a resist film on a substrate, using the actinic ray-sensitive or radiation-sensitive resin composition as described in any one of <1> to <10>;

a step of exposing the resist film to obtain an exposed resist film; and a step of developing the exposed resist film using a developer to form a pattern.

<13> The pattern forming method as described in <12>, in which a light source for the exposure is KrF.

<14> The pattern forming method as described in <12> or <13>, in which a film thickness of the resist film formed on the substrate is 500 nm or more.

<15> A method for manufacturing an electronic device, comprising the pattern forming method as described in any one of <12> to <14>.

According to the present invention, it is possible to provide an actinic ray-sensitive or radiation-sensitive resin composition capable of forming a pattern having an excellent CDU, and a resist film, a pattern forming method, and a method for manufacturing an electronic device, each using the actinic ray-sensitive or radiation-sensitive resin composition.

DESCRIPTION OF THE PREFERRED EMBODIMENTS

Hereinafter, an example of a form for carrying out the present invention will be described.

In the present specification, a numerical value range expressed using "to" means a range that includes the preceding and succeeding numerical values of "to" as a lower limit value and an upper limit value, respectively.

In notations for a group (atomic group) in the present specification, in a case where the group is noted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, the types of substituents, the positions of substituents, and the number of substituents in a case where it is described that "a substituent may be contained" are not particularly limited. The number of the substituents may be, for example, one, two, three, or more. Examples of the substituent include a monovalent non-metal atomic group excluding a hydrogen atom, and the substituent can be selected from, for example, the following substituent T.

(Substituent T)

Examples of the substituent T include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; alkyl groups; cycloalkyl groups; aryl groups; heteroaryl groups; a hydroxyl group; a carboxy group; a formyl group; a sulfo group; a cyano group; an alkylaminocarbonyl group; an arylaminocarbonyl group; a sulfonamide group; a silyl group; an amino group; a monoalkylamino group; a dialkylamino group; an arylamino group, a nitro group; a formyl group; and a combination thereof.

The bonding direction of divalent groups noted in the present specification is not limited unless otherwise specified. For example, in a compound represented by General Formula "L-M-N", M may be either *1-OCO—C(CN)═CH-*2 or *1-CH═C(CN)—COO-*2, assuming that in a case where M is —OCO—C(CN)═CH—, a position bonded to the L side is defined as *1 and a position bonded to the N side is defined as *2.

"(Meth)acryl" in the present specification is a generic term encompassing acryl and methacryl, and means "at least one of acryl or methacryl". Similarly, "(meth)acrylic acid" is a generic term encompassing acrylic acid and methacrylic acid, and means "at least one of acrylic acid or methacrylic acid".

In the present specification, the weight-average molecular weight (Mw), the number-average molecular weight (Mn), the Z-average molecular weight (Mz), and the molecular weight distribution (also described as a dispersity) (Mw/Mn) of a resin are each defined as a value expressed in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

"Actinic rays" or "radiation" in the present specification means, for example, a bright line spectrum of a mercury lamp, far ultraviolet rays typified by an excimer laser, extreme ultraviolet rays (EUV light), X-rays, electron beams (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays (EUV light), X-rays, or the like, but also lithography by particle beams such as electron beams and ion beams.

[Actinic Ray-Sensitive or Radiation-Sensitive Resin Composition]

The actinic ray-sensitive or radiation-sensitive resin composition of an embodiment of the present invention (hereinafter also referred to as "the composition of the embodiment of the present invention") is an actinic ray-sensitive or radiation-sensitive resin composition including a resin (A) including a repeating unit having an acid-decomposable group, and a resin (B) including a repeating unit having an acid-decomposable group, in which an absolute value $|G_A-G_B|$ of a difference between a mole-based content ratio $G_A$ of the repeating unit having an acid-decomposable group in the resin (A) and a mole-based content ratio $G_B$ of the repeating unit having an acid-decomposable group in the resin (B) is from 5% by mole to 20% by mole, the acid-decomposable group in the resin (A) and the acid-decomposable group in the resin (B) have the same structures, a ratio $S_A/S_B$ between a mass-based content ratio $S_A$ of the resin (A) to a mass-based content ratio $S_B$ of the resin (B) with respect to a total solid content in the actinic ray-sensitive or radiation-sensitive resin composition is 10/90 to 90/10, an absolute value $|Mw_A-Mw_B|$ of a difference between a weight-average molecular weight $Mw_A$ of the resin (A) and a weight-average molecular weight $Mw_B$ of the resin (B) is from 100 to 5,000, and the absolute value $|Mw_A/Mn_A-Mw_B/Mn_B|$ of a difference between a molecular weight distribution $Mw_A/Mn_A$ of the resin (A), which is a value $Mw_A/Mn_A$ obtained by dividing $Mw_A$ by a number-average molecular weight $Mn_A$, and a molecular weight distribution $Mw_B/Mn_B$ of the resin (B), which is a value $Mw_B/Mn_B$ obtained by dividing $Mw_B$ by a number-average molecular weight $Mn_B$, is 0.05 or more.

The reason why a pattern having an excellent CDU can be formed by the composition of the embodiment of the present invention has not been completely clarified, but is speculated to be as follows by the present inventors. Since the same kind of acid-decomposable resins easily aggregate, a region with a high density and a region with a low density are generated in the plane of a film formed using an actinic ray-sensitive or radiation-sensitive resin composition containing only one kind of acid-decomposable resin. Therefore, the CDU of a pattern obtained by exposing and developing the film is low in some cases. In addition, even in a case where two or more kinds of acid-decomposable resins are used, aggregation cannot be suppressed as a whole and an excellent CDU cannot be obtained in a case where the difference in properties between the resins is too small. In contrast, in a case where the difference in properties between the resins is too large, the individual resins aggregate and an excellent CDU cannot be obtained.

Therefore, as a result of intensive studies conducted by the present inventors, it was found that the actinic ray-sensitive or radiation-sensitive resin composition containing at least two kinds of acid-decomposable resins, in which the differences in the properties of the resins and the content ratio in the composition are within specific ranges, the aggregation is suppressed and a pattern having an excellent CDU can be formed.

The actinic ray-sensitive or radiation-sensitive resin composition of the embodiment of the present invention is typically a resist composition (preferably a chemically amplified resist composition), and may be either even a positive tone resist composition or a negative tone resist composition. In addition, the actinic ray-sensitive or radiation-sensitive resin composition of the embodiment of the present invention may be a resist composition for alkali development or a resist composition for organic solvent development.

<Resin (A) Including Repeating Unit Having Acid-Decomposable Group>

The resin (A) including a repeating unit having an acid-decomposable group (also simply referred to as a "resin (A)") included in the composition of the embodiment of the present invention will be described.

The resin (A) has a repeating unit having an acid-decomposable group.

The acid-decomposable group refers to a group that decomposes by the action of an acid to generate a polar group. The acid-decomposable group preferably has a structure in which a polar group is protected by a group that leaves by the action of an acid (leaving group). That is, the resin (A) preferably has a repeating unit having a group that decomposes by the action of an acid to generate a polar group. It is preferable that the polarity of the resin (A) increases by the action of an acid, and thus, the solubility in an alkali developer increases and the solubility in an organic solvent decreases.

As the polar group, an alkali-soluble group is preferable, and examples thereof include an acidic group such as a carboxyl group, a phenolic hydroxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

As the polar group, the carboxyl group, the phenolic hydroxyl group, the fluorinated alcohol group (preferably a hexafluoroisopropanol group), or the sulfonic acid group is preferable.

Examples of the group that leaves by the action of an acid (leaving group) include groups represented by Formulae (Y1) to (Y4).

$$—C(Rx_1)(Rx_2)(Rx_3) \qquad \text{Formula (Y1)}$$

$$—C(=O)OC(Rx_1)(Rx_2)(Rx_3) \qquad \text{Formula (Y2)}$$

$$—C(R_{36})(R_{37})(OR_{38}) \qquad \text{Formula (Y3)}$$

$$—C(Rn)(H)(Ar) \qquad \text{Formula (Y4)}$$

In Formula (Y1) and Formula (Y2), $Rx_1$ to $Rx_3$ each independently represent an (linear or branched) alkyl group or a (monocyclic or polycyclic) cycloalkyl group. Furthermore, in a case where all of $Rx_1$ to $Rx_3$ are each an (linear or branched) alkyl group, it is preferable that at least two of $Rx_1$, $Rx_2$, or $Rx_3$ are methyl groups.

Above all, it is preferable that $Rx_1$ to $Rx_3$ each independently represent a linear or branched alkyl group, and it is more preferable that $Rx_1$ to $Rx_3$ each independently represent the linear alkyl group.

Two of $Rx_1$ to $Rx_3$ may be bonded to each other to form a monocycle or a polycycle.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group is preferable, and a monocyclic cycloalkyl group having 5 or 6 carbon atoms is more preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the group represented by Formula (Y1) or Formula (Y2), for example, an aspect in which $Rx_1$ is a methyl group or an ethyl group, and $Rx_2$ and $Rx_3$ are bonded to each other to form a cycloalkyl group is preferable.

In Formula (Y3), $R_{36}$ to $R_{38}$ each independently represent a hydrogen atom or a monovalent substituent. $R_{37}$ and $R_{38}$ may be bonded to each other to form a ring. The monovalent substituent is not particularly limited, but examples thereof include an alkyl group, a cycloalkyl group, an aryl group, an aralkyl group, and an alkenyl group. It is also preferable that $R_{36}$ is the hydrogen atom.

As Formula (Y3), a group represented by Formula (Y3-1) is preferable.

(Y3-1)

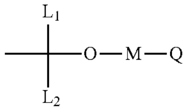

Here, $L_1$ and $L_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may have a heteroatom, a cycloalkyl group which may have a heteroatom, an aryl group which may have a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

Furthermore, it is preferable that one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane ring group. In these aspects, since the glass transition temperature (Tg) and the activation energy are increased, it is possible to suppress fogging in addition to ensuring film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

As the repeating unit having an acid-decomposable group, at least one of a repeating unit represented by General Formula (Aa1) or a repeating unit represented by General Formula (Aa2) is preferable.

(Aa1)

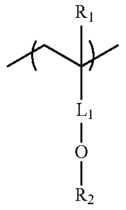

In General Formula (Aa1), $L_1$ represents a divalent linking group, $R_1$ represents a hydrogen atom, a fluorine atom, an iodine atom, an alkyl group, or an aryl group, and $R_2$ represents a group that leaves by the action of an acid.

$L_1$ represents a divalent linking group. Examples of the divalent linking group include —CO—, —O—, —S—, —SO—, —$SO_2$—, a hydrocarbon group (for example, an alkylene group, a cycloalkylene group, an alkenylene group, and an arylene group), and a linking group in which a plurality of these groups are linked. The hydrocarbon group may have a substituent.

$L_1$ is preferably a —CO—, an alkylene group, or a -allylene group.

As the arylene group, an arylene group having 6 to 20 carbon atoms is preferable, an arylene group having 6 to 10 carbon atoms is more preferable, and a phenylene group is still more preferable.

The alkylene group may be linear or branched. The number of carbon atoms of the alkylene group is not particularly limited, but is preferably 1 to 10, and more preferably 1 to 3. The alkylene group preferably has a fluorine atom or an iodine atom. The total number of the fluorine atoms and the iodine atoms included in the alkylene group is not particularly limited, but is preferably 2 or more, more preferably 2 to 10, and still more preferably 3 to 6.

$R_1$ represents a hydrogen atom, a fluorine atom, an iodine atom, an alkyl group, or an aryl group.

The alkyl group may be linear or branched. The number of carbon atoms of the alkyl group is not particularly limited, but is preferably 1 to 10, and more preferably 1 to 3.

In a case where the alkyl group has fluorine atoms or iodine atoms, the total number of the fluorine atoms and the iodine atoms included in the alkyl group having the fluorine atoms or the iodine atoms is not particularly limited, but is preferably 1 or more, more preferably 1 to 5, and still more preferably 1 to 3.

The alkyl group may have a heteroatom such as an oxygen atom, other than a halogen atom.

$R_2$ represents a group that leaves by the action of an acid (leaving group).

Examples of the leaving group include the groups represented by the Formulae (Y1) to (Y4) mentioned above, and preferred ranges thereof are also the same as those mentioned above.

(Aa2)

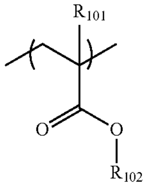

In General Formula (Aa2), $R_{101}$ represents a hydrogen atom, a fluorine atom, an iodine atom, an alkyl group, or an aryl group, and $R_{102}$ represents a group that leaves by the action of an acid.

$R_{101}$ represents a hydrogen atom, a fluorine atom, an iodine atom, an alkyl group, or an aryl group.

The alkyl group may be linear or branched. The number of carbon atoms of the alkyl group is not particularly limited, but is preferably 1 to 10, and more preferably 1 to 3.

In a case where the alkyl group has fluorine atoms or iodine atoms, the total number of the fluorine atoms and the iodine atoms included in the alkyl group having the fluorine atoms or the iodine atoms is not particularly limited, but is preferably 1 or more, more preferably 1 to 5, and still more preferably 1 to 3.

The alkyl group may have a heteroatom such as an oxygen atom, other than a halogen atom.

$R_{102}$ represents a leaving group that leaves by the action of an acid (leaving group).

Examples of the leaving group include the groups represented by the Formulae (Y1) to (Y4) mentioned above, and preferred ranges thereof are also the same as those mentioned above.

From the reason that a dissolution contrast before and after deprotection is large, as the repeating unit having an acid-decomposable group included in the resin (A), the repeating unit represented by General Formula (Aa2) is preferable, and a repeating unit represented by General Formula (AI) is more preferable.

(AI)

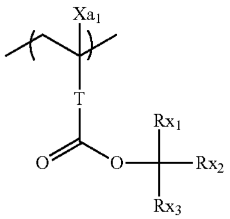

In General Formula (AI), $Xa_1$ represents a hydrogen atom or an alkyl group.

T represents a single bond or a divalent linking group.

$Rx_1$ to $Rx_3$ each independently represent an (linear or branched) alkyl group or a (monocyclic or polycyclic) cycloalkyl group. It should be noted that in a case where all of $Rx_1$ to $Rx_3$ are (linear or branched) alkyl groups, it is preferable that at least two of $Rx_1$, $Rx_2$, or $Rx_3$ are methyl groups.

Two of $Rx_1$ to $Rx_3$ may be bonded to each other to form a (monocyclic or polycyclic) cycloalkyl group.

The alkyl group represented by $Xa_1$ may have a substituent. Examples of the alkyl group represented by $Xa_1$ include a methyl group and a group represented by $—CH_2—R_{11}$. $R_{11}$ represents a halogen atom (a fluorine atom or the like), a hydroxyl group, or a monovalent substituent, examples thereof include an alkyl group having 5 or less carbon atoms, which may be substituted with a halogen atom, an acyl group having 5 or less carbon atoms, which may be substituted with a halogen atom, and an alkoxy group having 5 or less carbon atoms, which may be substituted with a halogen atom; and an alkyl group having 3 or less carbon atoms is preferable, and a methyl group is more preferable. $Xa_1$ is preferably a hydrogen atom, a methyl group, a trifluoromethyl group, or a hydroxymethyl group.

The divalent linking group represented by T may have a substituent.

Examples of the divalent linking group represented by T include an alkylene group, an aromatic ring group, a —COO—Rt- group, and an —O-Rt- group. In the formulae, Rt represents an alkylene group or a cycloalkylene group.

T is preferably the single bond or the —COO—Rt- group. In a case where T represents the —COO—Rt-group, Rt is preferably an alkylene group having 1 to 5 carbon atoms, and more preferably a $—CH_2—$ group, a $—(CH_2)_2—$ group, or a $—(CH_2)_3—$ group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the repeating unit represented by General Formula (AI), for example, an aspect in which $Rx_1$ is a methyl group or an ethyl group, and $Rx_2$ and $Rx_3$ are bonded to each other to form the above-mentioned cycloalkyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

The repeating unit represented by General Formula (AI) is preferably an acid-decomposable tertiary alkyl (meth) acrylate ester-based repeating unit (the repeating unit in which $Xa_1$ represents a hydrogen atom or a methyl group, and T represents a single bond).

It is also preferable that the resin (A) has at least one repeating unit selected from the group consisting of repeating units represented by General Formulae (A-VIII) to (A-XII) as the repeating unit having an acid-decomposable group.

(A-VIII)

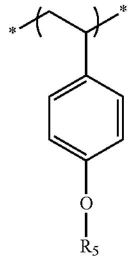

(A-IX)

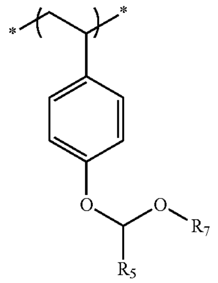

(A-X)

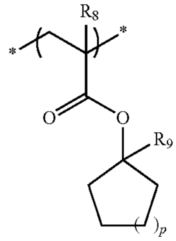

(A-XI)

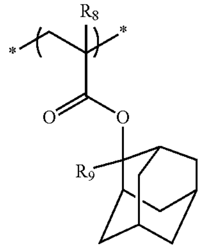

(A-XII)

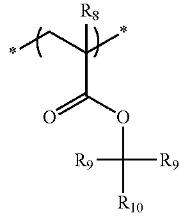

In General Formula (A-VIII), $R_5$ represents a tert-butyl group, a 1,1'-dimethylpropyl group, or a —CO—O-(tert-butyl) group.

In General Formula (A-IX), $R_6$ and $R_7$ each independently represent a monovalent substituent. Examples of the monovalent substituent include an alkyl group, a cycloalkyl group, an aryl group, an aralkyl group, and an alkenyl group.

In General Formula (A-X), p represents 1 or 2.

In General Formulae (A-X) to (A-XII), $R_8$ represents a hydrogen atom or an alkyl group having 1 to 3 carbon atoms, and $R_9$ represents an alkyl group having 1 to 3 carbon atoms.

In General Formula (A-XII), $R_{10}$ represents an alkyl group having 1 to 3 carbon atoms or an adamantyl group.

The resin (A) may have the repeating unit having an acid-decomposable group alone or in combination of two or more kinds thereof.

The mole-based content ratio $G_A$ of the repeating units having an acid-decomposable group in the resin (A) (a total content ratio of repeating units in the case where the repeating units having two or more kinds of acid-decomposable groups are contained) is preferably 70% by mole or less, more preferably 50% by mole or less, still more preferably 30% by mole or less, particularly preferably from 10% by mole to 30% by mole, and most preferably from 20% by mole to 30% by mole with respect to all the repeating units in the resin (A). As $G_A$ is larger, the dissolution contrast during development is larger and the CDU can be improved, but in a case where $G_A$ is too large, development defects tend to occur due to the hydrophobicity of the acid-decomposable group, and therefore, it is preferable that $G_A$ is within the range.

The resin (A) may have other repeating units in addition to the repeating unit having an acid-decomposable group.

In a case where the resin (A) has other repeating units, in addition to the repeating unit having an acid-decomposable group, the mole-based content ratio of such other repeating units in the resin (A) (a total content ratio of repeating units in a case of having two or more other repeating units) is preferably from 30% by mole to 90% by mole, more preferably from 50% by mole to 90% by mole, and particularly preferably from 70% by mole to 80% by mole with respect to all the repeating units in the resin (A).

Hereinafter, such other repeating units will be described.

(Repeating Unit Having Acid Group)

The resin (A) may have a repeating unit having an acid group.

As the repeating unit having an acid group, a repeating unit represented by General Formula (B) is preferable.

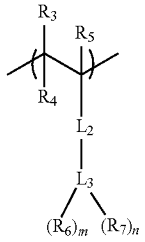

(B)

$R_3$ represents a hydrogen atom or a monovalent substituent. The monovalent substituent may have a fluorine atom or an iodine atom. As the monovalent substituent, a group represented by $-L_{40}-R_8$ is preferable. $L_{40}$ represents a single bond or an ester group. $R_8$ is an alkyl group which may have a fluorine atom or an iodine atom, a cycloalkyl group which may have a fluorine atom or an iodine atom, an aryl group which may have a fluorine atom or an iodine atom, or a group formed by combination thereof.

$R_4$ and $R_5$ each independently represent a hydrogen atom, a fluorine atom, an iodine atom, or an alkyl group which may have a fluorine atom or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group.

The alicyclic hydrocarbon ring group may be either a monocycle or a polycycle, and examples thereof include a cycloalkyl ring group.

$R_6$ represents a hydroxyl group or a fluorinated alcohol group (preferably a hexafluoroisopropanol group). Furthermore, in a case where $R_6$ is a hydroxyl group, $L_3$ is preferably the (n+m+1)-valent aromatic hydrocarbon ring group.

$R_7$ represents a halogen atom. Examples of the halogen atom include a fluorine atom, a chlorine atom, a bromine atom, and an iodine atom.

m represents an integer of 1 or more. m is preferably an integer of 1 to 3 and more preferably an integer of 1 or 2.

n represents 0 or an integer of 1 or more. n is preferably an integer of 1 to 4.

Furthermore, (n+m+1) is preferably an integer of 1 to 5.

As the repeating unit having an acid group, a repeating unit represented by General Formula (I) is also preferable.

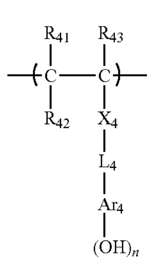

(I)

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, in which case $R_{42}$ represents a single bond or an alkylene group.

$X_4$ represents a single bond, —COO—, or —$CONR_{64}$—, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in General Formula (I) may be monocyclic or polycyclic. Among those, a monocyclic cycloalkyl group having 3 to 8 carbon atoms, such as a cyclopropyl group, a cyclopentyl group, and a cyclohexyl group, is preferable.

Examples of the halogen atom of each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in General Formula (I), the same ones as the alkyl group in each of $R_{41}$, $R_{42}$, and $R_{43}$ are preferable.

$Ar_4$ represents an (n+1)-valent aromatic ring group. The divalent aromatic ring group in a case where n is 1 may have a substituent, and is preferably, for example, an arylene group having 6 to 18 carbon atoms, such as a phenylene group, a tolylene group, a naphthylene group, and an anthracenylene group, or an aromatic ring group including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

Specific examples of the (n+1)-valent aromatic ring group in a case where n is an integer of 2 or more include groups formed by removing any (n−1) hydrogen atoms from the above-described specific examples of the divalent aromatic ring group. The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group, each mentioned above, include the alkyl groups; the alkoxy groups such as a methoxy group, an ethoxy group, a hydroxyethoxy group, a propoxy group, a hydroxypropoxy group, and a butoxy group; the aryl groups such as a phenyl group; and the like, as mentioned for each of $R_{41}$, $R_{42}$, and $R_{43}$ in General Formula (I).

Examples of the alkyl group of $R_{64}$ in —$CONR_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms, is preferable.

As $X_4$, a single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, and a biphenylene ring group are more preferable.

Specific examples of the repeating unit represented by General Formula (I) will be shown below, but the present invention is not limited thereto. In the formulae, a represents 1, 2, or 3.

(B-1)

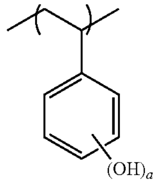

(B-2)

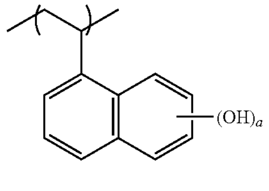

-continued
(B-3)
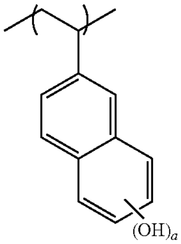
(B-4)
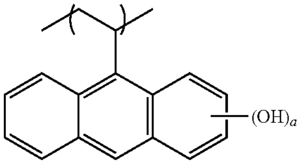
(B-5)
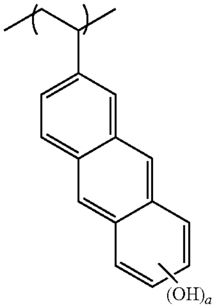
(B-6)
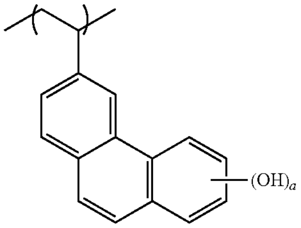
(B-7)
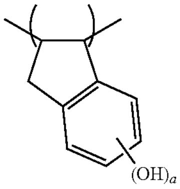
(B-8)
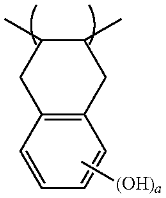
(B-9)
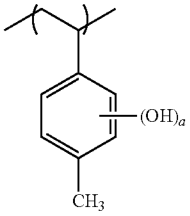
-continued
(B-10)
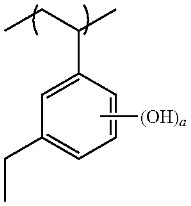
(B-11)
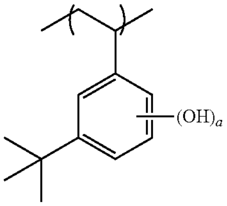
(B-12)
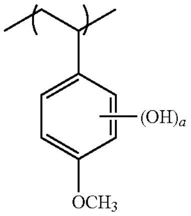
(B-13)
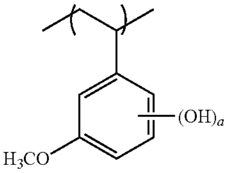
(B-14)
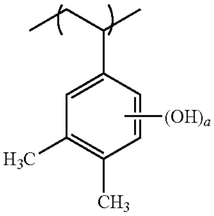
(B-15)
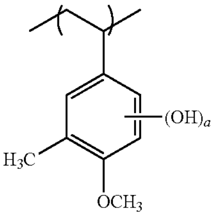
(B-16)
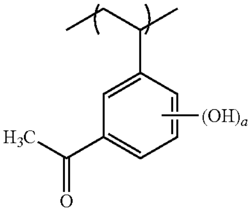

-continued
(B-17)
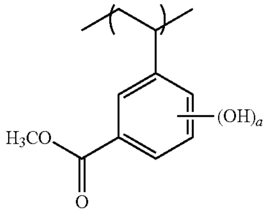
(B-18)
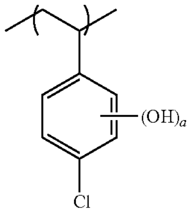
(B-19)
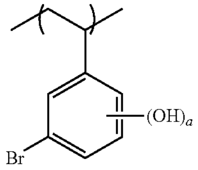
(B-20)
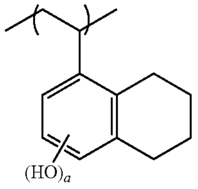
(B-21)
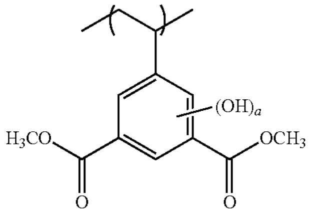
(B-22)
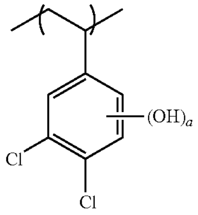
(B-23)
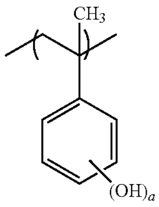
-continued
(B-24)
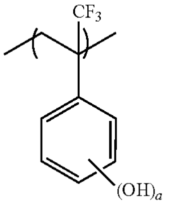
(B-25)
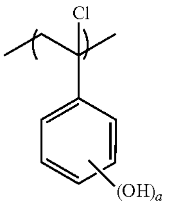
(B-26)
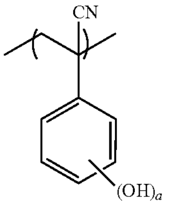
(B-27)
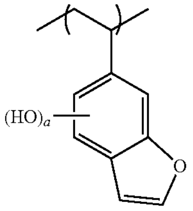
(B-28)
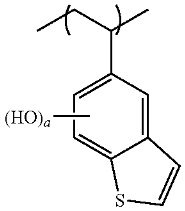
(B-29)
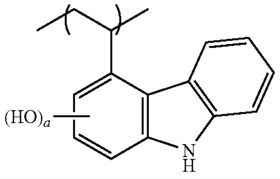
(B-30)
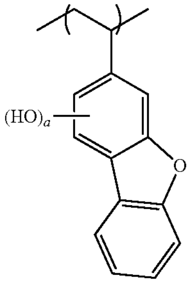

-continued (B-31)

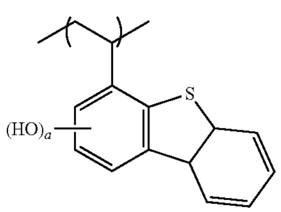

(B-32)

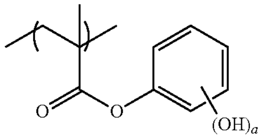

(B-33)

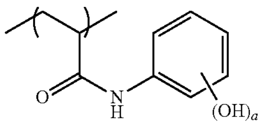

(B-34)

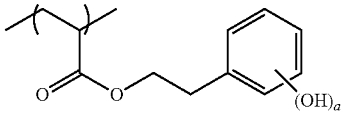

(B-35)

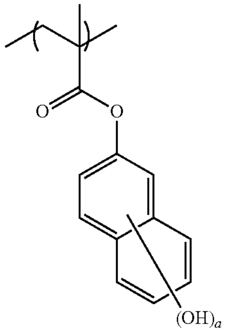

(B-36)

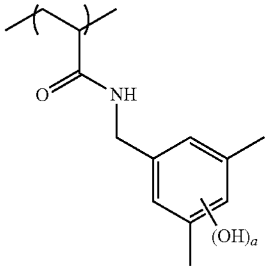

(B-37)

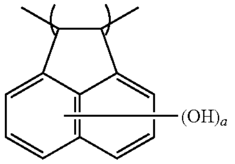

-continued (B-38)

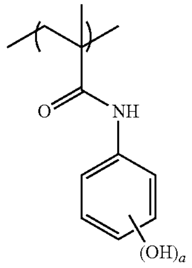

(Repeating Unit (A-2) Having at Least One Selected from Group Consisting of Lactone Structure, Sultone Structure, Carbonate Structure, and Hydroxyadamantane Structure)

The resin (A) may have a repeating unit (A-2) having at least one selected from the group consisting of a lactone structure, a carbonate structure, a sultone structure, and a hydroxyadamantane structure.

The lactone structure or the sultone structure in a repeating unit having the lactone structure or the sultone structure is not particularly limited, but is preferably a 5- to 7-membered ring lactone structure or a 5- to 7-membered ring sultone structure, and more preferably a 5- to 7-membered ring lactone structure to which another ring structure is fused to form a bicyclo structure or a spiro structure, or a 5- to 7-membered ring sultone structure to which another ring structure is fused so as to form a bicyclo structure or a spiro structure.

Examples of the repeating unit having the lactone structure or the sultone structure include the repeating units described in paragraphs 0094 to 0107 of WO2016/136354A.

The resin (A) may have a repeating unit having a carbonate structure. The carbonate structure is preferably a cyclic carbonic acid ester structure.

Examples of the repeating unit having a carbonate structure include the repeating unit described in paragraphs 0106 to 0108 of WO2019/054311A.

The resin (A) may have a repeating unit having a hydroxyadamantane structure. Examples of the repeating unit having a hydroxyadamantane structure include a repeating unit represented by General Formula (AIIa).

(AIIa)

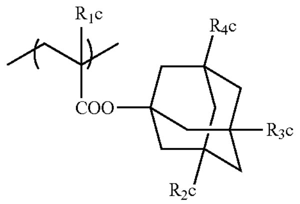

In General Formula (AIIa), $R_1c$ represents a hydrogen atom, a methyl group, a trifluoromethyl group, or a hydroxymethyl group. $R_2c$ to $R_4c$ each independently represent a hydrogen atom or a hydroxyl group. It should be noted that at least one of $R_2c$, . . . , or $R_4c$ represents a hydroxyl group. It is preferable that one or two of $R_2c$ to $R_4c$ are hydroxyl groups, and the rest are hydrogen atoms.

(Repeating Unit Having Fluorine Atom or Iodine Atom)

The resin (A) may have a repeating unit having a fluorine atom or an iodine atom.

Examples of the repeating unit having a fluorine atom or an iodine atom include the repeating units described in paragraphs 0076 to 0081 of JP2019-045864A.

(Repeating Unit Having Photoacid Generating Group)

The resin (A) may have, as a repeating unit other than those above, a repeating unit having a photoacid generating group (hereinafter also referred to as "a group that generates an acid upon irradiation with actinic rays or radiation").

Examples of the repeating unit having a photoacid generating group include the repeating units described in paragraphs 0092 to 0096 of JP2019-045864A.

(Repeating Unit Having Alkali-Soluble Group)

The resin (A) may have a repeating unit having an alkali-soluble group.

Examples of the alkali-soluble group include a carboxyl group, a sulfonamide group, a sulfonylimide group, a bissulfonylimide group, and an aliphatic alcohol group (for example, a hexafluoroisopropanol group) in which the α-position is substituted with an electron-withdrawing group, and the carboxyl group is preferable. By allowing the resin (A) to have a repeating unit having an alkali-soluble group, the resolution for use in contact holes increases.

Examples of the repeating unit having an alkali-soluble group include a repeating unit in which an alkali-soluble group is directly bonded to the main chain of a resin such as a repeating unit with acrylic acid and methacrylic acid, or a repeating unit in which an alkali-soluble group is bonded to the main chain of the resin through a linking group. Furthermore, the linking group may have a monocyclic or polycyclic cyclic hydrocarbon structure.

The repeating unit having an alkali-soluble group is preferably a repeating unit with acrylic acid or methacrylic acid.

(Repeating Unit Having Neither Acid-Decomposable Group Nor Polar Group)

The resin (A) may further have a repeating unit having neither an acid-decomposable group nor a polar group. The repeating unit having neither an acid-decomposable group nor a polar group preferably has an alicyclic hydrocarbon structure.

Examples of the repeating unit having neither an acid-decomposable group nor a polar group include the repeating units described in paragraphs 0236 and 0237 of the specification of US2016/0026083A and the repeating units described in paragraph 0433 of the specification of US2016/0070167A.

The resin (A) may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.

The resin (A) can be synthesized in accordance with an ordinary method (for example, radical polymerization).

The weight-average molecular weight ($Mw_A$) of the resin (A) is preferably in a range of 1,000 to 200,000, more preferably in a range of 3,000 to 50,000, and still more preferably in a range of 5,000 to 30,000. By setting the $Mw_A$ to be within the range, it is possible to prevent the deterioration of heat resistance and dry etching resistance, and also prevent the deterioration of film forming properties due to deteriorated developability or increased viscosity. In addition, in a case where the $Mw_A$ is 1,000 or more, the glass transition temperature of a film formed using the composition of the embodiment of the present invention can be elevated, and thus, the diffusion of the acid is suppressed and the CDU is improved. In a case where the $Mw_A$ is 200,000 or less, the volume of the resin (A) per molecule is not excessively large, rattling of the pattern is suppressed and the CDU is improved. Furthermore, the $Mw_A$ is a value in terms of polystyrene measured by the above-mentioned GPC method.

The molecular weight distribution ($Mw_A/Mn_A$) of the resin (A), which is a value obtained by dividing the $Mw_A$ by the number-average molecular weight $Mn_A$ of the resin (A), is usually 1.00 to 5.00, preferably 1.00 to 3.00, and more preferably 1.10 to 2.00. The smaller the molecular weight distribution, the better the resolution and the resist shape, the smoother the side wall of a pattern, and the more excellent the roughness. In addition, the smaller the molecular weight distribution, the more uniform the polymer, the more uniform the polymer, and the more the rattling of the pattern can be suppressed, whereby the CDU is improved.

The Z-average molecular weight ($Mz_A$) of the resin (A) is preferably in a range of 1,000 to 200,000, more preferably in a range of 3,000 to 100,000, and still more preferably in a range of 5,000 to 50,000. Furthermore, the $Mz_A$ is a value in terms of polystyrene measured by the above-mentioned GPC method. In a case where the molecular weight at each elution position of the molecular weight distribution curve is defined as Mi and the number of molecules is defined as Ni, the Z-average molecular weight Mz can be determined by the following equation.

$$Mz=\Sigma(Ni\cdot Mi^3)/\Sigma(Ni\cdot Mi^2)$$

The mass-based content ratio ($S_A$) of the resin (A) with respect to the total solid content in the composition of the embodiment of the present invention is preferably 40% to 90% by mass, and more preferably 50% to 80% by mass.

Moreover, in the present specification, the solid content means components other than the solvent. Even in a case where the properties of the components are liquid, they are treated as solid contents. The total solid content means a total of all the solid contents.

<Resin (B) Including Repeating Unit Having Acid-Decomposable Group>

In addition to the resin (A), the composition of the embodiment of the present invention further contains a resin (B) including a repeating unit having an acid-decomposable group (also simply referred to as a "resin (B)").

The resin (A) and the resin (B) satisfy all of the following conditions 1 to 5.

Condition 1: The absolute value $|G_A-G_B|$ of a difference between a mole-based content ratio $G_A$ of the repeating unit having an acid-decomposable group in the resin (A) and a mole-based content ratio $G_B$ of the repeating unit having an acid-decomposable group in the resin (B) is from 5% by mole to 20% by mole.

Condition 2: The acid-decomposable group in the resin (A) and the acid-decomposable group in the resin (B) have the same structures.

Condition 3: The ratio $S_A/S_B$ between a mass-based content ratio $S_A$ of the resin (A) to a mass-based content ratio $S_B$ of the resin (B), with respect to a total solid content in the actinic ray-sensitive or radiation-sensitive resin composition, is 10/90 to 90/10.

Condition 4: The absolute value $|Mw_A-Mw_B|$ of a difference between a weight-average molecular weight $Mw_A$ of the resin (A) and a weight-average molecular weight $Mw_B$ of the resin (B) is from 100 to 5,000.

Condition 5: The absolute value $|Mw_A/Mn_A-Mw_B/Mn_B|$ of a difference between a molecular weight distribution $Mw_A/Mn_A$ of the resin (A), which is a value $Mw_A/Mn_A$ obtained by dividing $Mw_A$ by a number-average molecular weight $Mn_A$, and a molecular weight distribution $Mw_B/Mn_B$ of the resin (B), which is a value $Mw_B/Mn_B$ obtained by dividing $Mw_B$ by a number-average molecular weight $Mn_B$, is 0.05 or more.

The repeating unit having an acid-decomposable group included in the resin (B) is the same as that in the resin (A) mentioned above. In addition, other repeating units which may be included the resin (B) are the same as those in the resin (A) mentioned above.

Furthermore, as described in Condition 2, the acid-decomposable group in the resin (B) is the same as the acid-decomposable group in the resin (A). By satisfying Condition 2, each aggregation of the resin (A) and the resin (B) can be suppressed, and an excellent CDU can be obtained.

The mole-based content ratio $G_B$ of the repeating units having an acid-decomposable group in the resin (B) (a total content ratio of repeating units in the case where the repeating units having two or more kinds of acid-decomposable groups are contained) is preferably 70% by mole or less, more preferably 50% by mole or less, still more preferably 30% by mole or less, particularly preferably from 10% by mole to 30% by mole, and most preferably from 20% by mole to 30% by mole with respect to all the repeating units in the resin (B).

It should be noted that as described in Condition 1, the absolute value $|G_A-G_B|$ of a difference between a mole-based content ratio $G_A$ of the repeating unit having an acid-decomposable group in the resin (A) and a mole-based content ratio $G_B$ of the repeating unit having an acid-decomposable group in the resin (B) is from 5% by mole to 20% by mole. By satisfying Condition 1, aggregation between the resin (A) and the resin (B), aggregation between the resins (A), and aggregation between the resins (B) can be suppressed, and an excellent CDU can be obtained.

$|G_A-G_B|$ is preferably from 10% by mole to 20% by mole, more preferably from 10% by mole to 18% by mole, and still more preferably from 10% by mole to 15% by mole.

The weight-average molecular weight ($Mw_B$) of the resin (B) is preferably in a range of 1,000 to 200,000, more preferably in a range of 3,000 to 50,000, and still more preferably in a range of 5,000 to 30,000. By setting the $Mw_B$ to be within the range, it is possible to prevent the deterioration of heat resistance and dry etching resistance, and also prevent the deterioration of film forming properties due to deteriorated developability or increased viscosity. In addition, in a case where the $Mw_B$ is 1,000 or more, the glass transition temperature of a film formed using the composition of the embodiment of the present invention can be increased, whereby the diffusion of the acid is suppressed and the CDU is improved. In a case where the $Mw_B$ is 200,000 or less, the volume of the resin (B) per molecule is not excessively large, rattling of the pattern is suppressed and the CDU is improved. Furthermore, the $Mw_B$ is a value in terms of polystyrene measured by the above-mentioned GPC method.

It should be noted that as described in Condition 4 above, the absolute value $|Mw_A-Mw_B|$ of a difference between a weight-average molecular weight $Mw_A$ of the resin (A) and a weight-average molecular weight $Mw_B$ of the resin (B) is from 100 to 5,000. By satisfying Condition 4, aggregation between the resin (A) and the resin (B), aggregation between the resins (A), and aggregation between the resins (B) can be suppressed, and an excellent CDU can be obtained.

$|Mw_A-Mw_B|$ is preferably from 200 to 5,000, more preferably from 500 to 5,000, and still more preferably from 1,000 to 5,000.

The molecular weight distribution ($Mw_B/Mn_B$) of the resin (B), which is a value obtained by dividing the $Mw_B$ by the number-average molecular weight $Mn_B$ of the resin (B), is usually 1.00 to 5.00, preferably 1.00 to 3.00, and more preferably 1.10 to 2.00. The smaller the molecular weight distribution, the better the resolution and the resist shape, the smoother the side wall of a pattern, and the more excellent the roughness. In addition, the smaller the molecular weight distribution, the more uniform the polymer, the more uniform the polymer, and the more the rattling of the pattern can be suppressed, whereby the CDU is improved.

It should be noted that as described in Condition 5, $|Mw_A/Mn_A-Mw_B/Mn_B|$ is 0.05 or more. By satisfying Condition 5, aggregation between the resin (A) and the resin (B) can be suppressed, and an excellent CDU can be obtained.

$|Mw_A/Mn_A-Mw_B/Mn_B|$ is preferably 0.10 or more, more preferably from 0.10 to 0.30, and still more preferably from 0.10 to 0.20, and particularly preferably from 0.10 to 0.15.

The Z-average molecular weight ($Mz_B$) of the resin (B) is preferably in a range of 1,000 to 200,000, more preferably in a range of 3,000 to 100,000, and still more preferably in a range of 5,000 to 50,000. Furthermore, the $Mz_B$ is a value in terms of polystyrene measured by the above-mentioned GPC method.

$|Mz_A-Mz_B|$ which is the absolute value of the difference between the Z-average molecular weight MzA of the resin (A) and the Z-average molecular weight $Mz_B$ of the resin (B) is preferably 100 or more, more preferably 1,000 or more, still more preferably from 1,000 to 10,000, and particularly preferably from 1,000 to 5,000.

The mass-based content ratio ($S_B$) of the resin (B) with respect to the total solid content in the composition of the embodiment of the present invention is preferably 40% to 90% by mass, and more preferably 50% to 80% by mass.

It should be noted that as described in Condition 3, $S_A/S_B$, a ratio of the mass-based content ratio $S_A$ of the resin (A) with respect to the total solid content in the composition of the embodiment of the present invention to the mass-based content $S_B$ of the resin ratio (B) with respect to the total solid content in the composition of the embodiment of the present invention is 10/90 to 90/10. By satisfying Condition 5, each aggregation of the resin (A) and the resin (B) can be suppressed, and an excellent CDU can be obtained.

$S_A/S_B$ is preferably 40/60 to 60/40, and more preferably 45/55 to 55/45.

The composition of the embodiment of the present invention contains at least two kinds of acid-decomposable resins. In a case where the composition of the embodiment of the present invention includes two kinds of acid-decomposable resins, one of the acid-decomposable resins is the resin (A) and the other is the resin (B). In a case where the composition of the embodiment of the present invention contains three or more kinds of acid-decomposable resins corresponding to the resin (A) or the resin (B), for convenience, a resin having the highest mole-based content ratio of the repeating unit having an acid-decomposable group may be taken as the resin (A), and the other resin may be used as the resin (B). In this case, the mass-based content ratio $S_B$ of the resin (B) with respect to the total solid content in the composition of the embodiment of the present invention, the mole-based content ratio $G_B$ of the repeating unit having an acid-decomposable group in the resin (B), the weight-average molecular weight $Mw_B$ of the resin (B), the number-average molecular weight $Mn_B$ of the resin (B), and the Z-average molecular weight $Mz_B$ of the resin (B) can be determined as follows. That is, in a case where n kinds of resins corresponding to the resin (B) are present, $S_B$ is determined by Expression (1), $G_B$ is determined by Expression (2), $Mw_B$ is determined by Expression (3), $Mn_B$ is determined by Expression (4), and $Mz_B$ can be determined by Expression (5). It should be noted that n represents an integer of 2 or more, i represents an integer of 1 to n, $S_{Bi}$ represents the mass-based content ratio of each resin corresponding to the resin (B) in the composition of the embodiment of the present invention, $G_{Bi}$ represents the mole-based content ratio of each repeating unit having an acid-decomposable group in each resin corresponding to the resin (B), $Mw_{Bi}$ represents the weight-average molecular weight of each resin corresponding to the resin (B), $Mn_{Bi}$ represents the number-average molecular weight of each resin corresponding to the resin (B), $Mz_{Bi}$ represents the Z-average molecular weight of each resin corresponding to the resin (B), and $X_{Bi}$ represents the mass-based content ratio of each resin corresponding to the resin (B) with respect to the total of the resin (B).

[Expression 1]

$$S_B = \sum_{i=1}^{n} S_{Bi} \quad \text{Expression (1)}$$

[Expression 2]

$$G_B = \sum_{i=1}^{n}\left(G_{Bi} \cdot \frac{X_{Bi}}{100}\right) \quad \text{Expression (2)}$$

[Expression 3]

$$Mw_B = \sum_{i=1}^{n}\left(Mw_{Bi} \cdot \frac{X_{Bi}}{100}\right) \quad \text{Expression (3)}$$

[Expression 4]

$$Mn_B = \sum_{i=1}^{n}\left(Mn_{Bi} \cdot \frac{X_{Bi}}{100}\right) \quad \text{Expression (4)}$$

[Expression 5]

$$Mz_B = \sum_{i=1}^{n}\left(Mz_{Bi} \cdot \frac{X_{Bi}}{100}\right) \quad \text{Expression (5)}$$

<Compound that Generates Acid Upon Irradiation with Actinic Rays or Radiation (Photoacid Generator)>

The composition of the embodiment of the present invention preferably contains a compound that generates an acid upon irradiation with actinic rays or radiation (also described as a "photoacid generator (C)").

The photoacid generator (C) is not particularly limited as long as it is a compound that generates an acid by irradiation with actinic rays or radiation.

The photoacid generator (C) may be in a form of a low-molecular-weight compound or a form incorporated into a part of a polymer. In addition, a combination of the form of a low-molecular-weight compound and the form incorporated into a part of a polymer may also be used.

In a case where the photoacid generator (C) is in the form of the low-molecular-weight compound, the weight-average molecular weight (Mw) is preferably 3,000 or less, more preferably 2,000 or less, and still more preferably 1,000 or less.

The photoacid generator (C) may be incorporated in a part of the resin (A) or the resin (B), or may be incorporated in a resin which is different from the resin (A) or the resin (B).

The photoacid generator (C) is preferably in the form of a low-molecular-weight compound.

The photoacid generator (C) is preferably an ionic compound that includes a cation and an anion.

The photoacid generator (C) is preferably a compound that generates an organic acid upon irradiation with actinic rays or radiation, and more preferably a compound that generates an organic acid upon irradiation with actinic rays or radiation, and has a fluorine atom or an iodine atom in the molecule. Examples of the organic acid include sulfonic acids (an aliphatic sulfonic acid, an aromatic sulfonic acid, and a camphor sulfonic acid), carboxylic acids (an aliphatic carboxylic acid, an aromatic carboxylic acid, and an aralkylcarboxylic acid), a carbonylsulfonylimide acid, a bis(alkylsulfonyl)imide acid, and a tris(alkylsulfonyl)methide acid.

Suitable aspects of the photoacid generator (C) include, for example, a compound represented by General Formula (ZI), a compound represented by General Formula (ZII), and a compound represented by General Formula (ZIII).

(ZI)

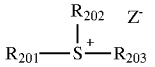

(ZII)

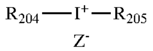

(ZIII)

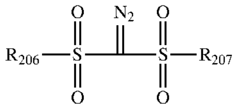

In General Formula (ZI), $R_{201}$, $R_{202}$, and $R_{203}$ each independently represent an organic group.

The number of carbon atoms of the organic group as each of $R_{201}$, $R_{202}$, and $R_{203}$ is preferably 1 to 30, and more preferably 1 to 20.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group), and $—CH_2—CH_2—O—CH_2—CH_2—$.

$Z^-$ represents an anion.

(Cation in Compound Represented by General Formula (ZI))

Suitable aspects of the cation in General Formula (ZI) include the corresponding groups in compounds (ZI-1), (ZI-2), (ZI-3), and (ZI-4) which will be described later.

Furthermore, the photoacid generator (C) may be a compound having a plurality of structures represented by General Formula (ZI). For example, the photoacid generator may be a compound having a structure in which at least one of $R_{201}$, $R_{202}$, or $R_{203}$ of the compound represented by General Formula (ZI) and at least one of $R_{201}$, $R_{202}$, or $R_{203}$ of another compound represented by General Formula (ZI) are bonded through a single bond or a linking group.

(Compound (ZI-1))

First, the compound (ZI-1) will be described.

The compound (ZI-1) is an arylsulfonium compound in which at least one of $R_{201}$, $R_{202}$, or $R_{203}$ in General Formula (ZI) is an aryl group, that is, a compound having arylsulfonium as a cation.

In the arylsulfonium compound, all of $R_{201}$ to $R_{203}$ may be aryl groups, or some of $R_{201}$ to $R_{203}$ may be an aryl group, and the rest may be an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

As the aryl group of the arylsulfonium compound, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, the two or more aryl groups may be the same as or different from each other.

The alkyl group or the cycloalkyl group contained in the arylsulfonium compound, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R_{201}$ to $R_{203}$ may each independently have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as a substituent.

(Compound (ZI-2))

Next, the compound (ZI-2) will be described.

The compound (ZI-2) is a compound in which $R_{201}$ to $R_{203}$ in General Formula (ZI) each independently represent an organic group having no aromatic ring. Here, the aromatic ring also includes an aromatic ring containing a heteroatom.

The organic group having no aromatic ring as each of $R_{201}$ to $R_{203}$ generally has 1 to 30 carbon atoms, and preferably has 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Preferred examples of the alkyl group and the cycloalkyl group of each of $R_{201}$ to $R_{203}$ include a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group).

$R_{201}$ to $R_{203}$ may be further substituted with a halogen atom, an alkoxy group (for example, having 1 to 5 carbon atoms), a hydroxyl group, a cyano group, or a nitro group.

(Compound (ZI-3))

Next, the compound (ZI-3) will be described.

The compound (ZI-3) is a compound represented by General Formula (ZI-3) and having a phenacylsulfonium salt structure.

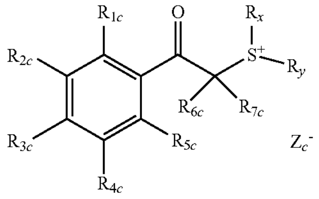

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more of $R_{1c}$, . . . , or $R_{5c}$, $R_{5c}$ and $R_{6c}$, $R_{6c}$ and $R_{7c}$, $R_{5c}$ and $R_x$, and $R_x$ and $R_y$ may each be bonded to each other to form a ring structure, and the ring structure may each independently include an oxygen atom, a sulfur atom, a ketone group, an ester bond, or an amide bond.

$Zc^-$ represents an anion.

Any two or more of $R_{1c}$, . . . , or $R_{5c}$, $R_{5c}$ and $R_{6c}$, $R_{6c}$ and $R_{7c}$, $R_{5c}$ and $R_x$, and $R_x$ and $R_y$ may each be bonded to each other to form a ring structure, and the ring structure may each independently include an oxygen atom, a sulfur atom, a ketone group, an ester bond, or an amide bond.

Examples of the ring structure include an aromatic or non-aromatic hydrocarbon ring, an aromatic or non-aromatic heterocyclic ring, and a polycyclic fused ring in which two or more of these rings are combined. Examples of the ring structure include a 3- to 10-membered ring and the ring structure is preferably a 4- to 8-membered ring, and more preferably a 5- or 6-membered ring.

Examples of the group formed by the bonding of any two or more of $R_{1c}$, . . . , or $R_{5c}$, $R_{6c}$ and $R_{7c}$, and $R_x$ and $R_y$ include a butylene group and a pentylene group.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

The alkyl group as each of $R_{6c}$ and $R_{7c}$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms.

The alkyl group may have a substituent.

The cycloalkyl group as each of $R_{6c}$ and $R_{7c}$ is not particularly limited, but may be a monocycle or a polycycle, and is preferably a cycloalkyl group having 3 to 20 carbon atoms, more preferably a cycloalkyl group having 3 to 15 carbon atoms, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent.

The aryl group as each of $R_{6c}$ and $R_{7c}$ is not particularly limited, and may be a monocycle or a polycycle, and is preferably an aryl group having 6 to 20 carbon atoms, more preferably an aryl group having 6 to 15 carbon atoms, and still more preferably an aryl group having 6 to 10 carbon atoms.

The aryl group may have a substituent.

$R_{6c}$ and $R_{7c}$ are each independently preferably a hydrogen atom, an alkyl group, or a cycloalkyl group, and more preferably the hydrogen atom or the alkyl group.

The alkyl group as each of $R_x$ and $R_y$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms.

The alkyl group may have a substituent.

The cycloalkyl group as each of $R_x$ and $R_y$ is not particularly limited, but may be a monocycle or a polycycle, and is preferably a cycloalkyl group having 3 to 20 carbon atoms, more preferably a cycloalkyl group having 3 to 15 carbon atoms, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent.

The 2-oxoalkyl group as each of $R_x$ and $R_y$ is not particularly limited, but is preferably a 2-oxoalkyl group having 1 to 20 carbon atoms, more preferably a 2-oxoalkyl group having 1 to 15 carbon atoms, and still more preferably a 2-oxoalkyl group having 1 to 10 carbon atoms.

The 2-oxoalkyl group may have a substituent.

The 2-oxocycloalkyl group as each of $R_x$ and $R_y$ is not particularly limited, but is preferably a 2-oxocycloalkyl group having 3 to 20 carbon atoms, more preferably a 2-oxocycloalkyl group having 3 to 15 carbon atoms, and still more preferably a 2-oxocycloalkyl group having 3 to 10 carbon atoms.

The 2-oxocycloalkyl group may have a substituent.

The alkoxycarbonylalkyl as each of $R_x$ and $R_y$ is not particularly limited, but is preferably an alkoxycarbonylalkyl group having 3 to 22 carbon atoms, more preferably an alkoxycarbonylalkyl group having 3 to 17 carbon atoms, and still more preferably an alkoxycarbonylalkyl group having 3 to 12 carbon atoms.

The alkoxycarbonylalkyl group may have a substituent.

$R_x$ and $R_y$ may be linked to each other to form a ring, and the ring structure may include an oxygen atom, a nitrogen atom, a sulfur atom, a ketone group, an ether bond, an ester bond, or an amide bond.

The ring structure preferably includes an oxygen atom.

Examples of the ring structure include an aromatic or non-aromatic hydrocarbon ring, an aromatic or non-aromatic heterocyclic ring, and a polycyclic fused ring in which two or more of these rings are combined. Examples of the ring structure include a 3- to 10-membered ring and the ring structure is preferably a 4- to 8-membered ring, and more preferably a 5- or 6-membered ring.

(Compound (ZI-4))

Next, the compound (ZI-4) will be described.

The compound (ZI-4) is represented by General Formula (ZI-4).

(ZI-4)

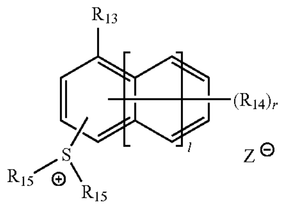

In General Formula (ZI-4), l represents an integer of 0 to 2.

r represents an integer of 0 to 8.

$R_{13}$ represents a hydrogen atom, a fluorine atom, a hydroxyl group, an alkyl group, a cycloalkyl group, an alkoxy group, or an alkoxycarbonyl group.

$R_{14}$ represents a hydroxyl group, an alkyl group, a cycloalkyl group, an alkoxy group, an alkoxycarbonyl group, an alkylcarbonyl group, an alkylsulfonyl group, or a cycloalkylsulfonyl group. In a case where a plurality of $R_{14}$'s are present, $R_{14}$'s may be the same as or different from each other.

$R_{15}$'s each independently represent an alkyl group, a cycloalkyl group, or a naphthyl group. Two $R_{15}$'s may be bonded to each other to form a ring. In a case where two $R_{15}$'s are bonded to each other to form a ring, the ring skeleton may include a heteroatom such as an oxygen atom and a nitrogen atom.

$Z^-$ represents an anion.

In General Formula (ZI-4), the alkyl group in each of $R_{13}$, $R_{14}$, and $R_{15}$ is linear or branched, preferably has 1 to 10 carbon atoms, and is more preferably a methyl group, an ethyl group, an n-butyl group, a t-butyl group, or the like.

The alkyl group as $R_{13}$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms, and specifically, a methyl group, an ethyl group, an n-butyl group, or a t-butyl group is preferable.

The alkyl group may have a substituent.

The cycloalkyl group as $R_{13}$ is not particularly limited, but may be a monocycle or a polycycle, and is preferably a cycloalkyl group having 3 to 20 carbon atoms, more preferably a cycloalkyl group having 3 to 15 carbon atoms, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent.

The alkoxy group as $R_{13}$ is not particularly limited, but is preferably an alkoxy group having 1 to 20 carbon atoms, more preferably an alkoxy group having 1 to 15 carbon atoms, and still more preferably an alkoxy group having 1 to 10 carbon atoms.

The alkoxy group may have a substituent.

The alkoxycarbonyl group as $R_{13}$ is not particularly limited, but is preferably an alkoxycarbonyl group having 2 to 21 carbon atoms, more preferably an alkoxycarbonyl group having 2 to 16 carbon atoms, and still more preferably an alkoxycarbonyl group having 2 to 11 carbon atoms.

The alkoxycarbonyl group may have a substituent.

The alkyl group as $R_{14}$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms, and specifically, a methyl group, an ethyl group, an n-butyl group, or a t-butyl group is preferable.

The alkyl group may have a substituent.

The cycloalkyl group as $R_{14}$ is not particularly limited, but may be a monocycle or a polycycle, and is preferably a cycloalkyl group having 3 to 20 carbon atoms, more preferably a cycloalkyl group having 3 to 15 carbon atoms, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent.

The alkoxy group as $R_{14}$ is not particularly limited, but is preferably an alkoxy group having 1 to 20 carbon atoms, more preferably an alkoxy group having 1 to 15 carbon atoms, and still more preferably an alkoxy group having 1 to 10 carbon atoms.

The alkoxy group may have a substituent.

The alkoxycarbonyl group as $R_{14}$ is not particularly limited, but is preferably an alkoxycarbonyl group having 2 to 21 carbon atoms, more preferably an alkoxycarbonyl group having 2 to 16 carbon atoms, and still more preferably an alkoxycarbonyl group having 2 to 11 carbon atoms.

The alkoxycarbonyl group may have a substituent.

The alkylcarbonyl group as $R_{14}$ is not particularly limited, but is preferably an alkylcarbonyl group having 2 to 21 carbon atoms, more preferably an alkylcarbonyl group having 2 to 16 carbon atoms, and still more preferably an alkylcarbonyl group having 2 to 11 carbon atoms.

The alkylcarbonyl group may have a substituent.

The alkylsulfonyl group as $R_{14}$ is not particularly limited, but is preferably an alkylsulfonyl group having 1 to 20 carbon atoms, more preferably an alkylsulfonyl group having 1 to 15 carbon atoms, and still more preferably an alkylsulfonyl group having 1 to 10 carbon atoms.

The alkylsulfonyl group may have a substituent.

The cycloalkylsulfonyl group as $R_{14}$ is not particularly limited, but is preferably a cycloalkylsulfonyl group having 3 to 20 carbon atoms, more preferably a cycloalkylsulfonyl group having 3 to 15 carbon atoms, and still more preferably a cycloalkylsulfonyl group having 3 to 10 carbon atoms.

The cycloalkylsulfonyl group may have a substituent.

In a case where a plurality of $R_{14}$'s are present, the plurality of $R_{14}$'s may be the same as or different from each other.

The alkyl group as $R_{15}$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms, and specifically, a methyl group, an ethyl group, an n-butyl group, or a t-butyl group is preferable.

The alkyl group may have a substituent.

The cycloalkyl group as $R_{15}$ is not particularly limited, but may be a monocycle or a polycycle, and is preferably a cycloalkyl group having 3 to 20 carbon atoms, more preferably a cycloalkyl group having 3 to 15 carbon atom, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent.

The naphthyl group as $R_{15}$ may have a substituent.

Two $R_{15}$'s may be bonded to each other to form a ring. In a case where two $R_{15}$'s are bonded to each other to form a ring, the ring structure may include an oxygen atom, a nitrogen atom, a sulfur atom, a ketone group, an ether bond, an ester bond, or an amide bond.

The ring structure preferably includes an oxygen atom.

Examples of the ring structure include an aromatic or non-aromatic hydrocarbon ring, an aromatic or non-aromatic heterocyclic ring, and a polycyclic fused ring in which two or more of these rings are combined. Examples of the ring structure include a 3- to 10-membered ring and the ring structure is preferably a 4- to 8-membered ring, and more preferably a 5- or 6-membered ring.

In one preferred aspect, it is preferable that two $R_{15}$'s are alkyl groups and are bonded to each other to form a ring structure.

(Cation in Compound Represented by General Formula (ZII) or General Formula Z (III))

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

As the aryl group of each of $R_{204}$ to $R_{207}$, a phenyl group or a naphthyl group is preferable, and the phenyl group is more preferable. The aryl group of each of $R_{204}$ to $R_{207}$ may be an aryl group which has a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group of each of $R_{204}$ to $R_{207}$ include a linear alkyl group having 1 to 10 carbon atoms or branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

The aryl group, the alkyl group, and the cycloalkyl group of each of $R_{204}$ to $R_{207}$ may each independently have a substituent. Examples of the substituent which may be contained in each of the aryl group, the alkyl group, and the cycloalkyl group of each of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion.

(Anion in Compound Represented by General Formula (ZI), General Formula (ZII), General Formula (ZI-3), or General Formula (ZI-4))

As $Z^-$ in General Formula (ZI), $Z^-$ in General Formula (ZII), $Zc^-$ in General Formula (ZI-3), and $Z^-$ in General Formula (ZI-4), an anion represented by General Formula (3) is preferable.

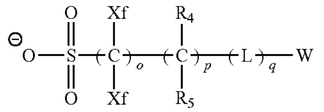

(3)

In General Formula (3),

Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and in a case where a plurality of $R_4$'s and $R_5$'s are present, they may be the same as or different from each other.

L represents a divalent linking group, and in a case where a plurality of L's are present, they may be the same as or different from each other.

W represents an organic group.

o represents an integer of 1 to 3. p represents an integer of 0 to 10. q represents an integer of 0 to 10.

Xf represents a fluorine atom or an alkyl group substituted with at least one fluorine atom. The alkyl group preferably has 1 to 10 carbon atoms, and more preferably has 1 to 4 carbon atoms. In addition, the alkyl group substituted with at least one fluorine atom is preferably a perfluoroalkyl group. Xf's which are present in a plural number may be the same as or different from each other.

Xf is preferably the fluorine atom or the perfluoroalkyl group having 1 to 4 carbon atoms. Xf is more preferably the fluorine atom or $CF_3$. It is particularly preferable that all of Xf's are fluorine atoms.

$R_4$ and $R_5$ each independently represent a hydrogen atom, a fluorine atom, an alkyl group, or an alkyl group substituted with at least one fluorine atom. In a case where a plurality of each of $R_4$'s and $R_5$'s are present, they may be the same as or different from each other.

The alkyl group represented by each of $R_4$ and $R_5$ may have a substituent, and preferably has 1 to 4 carbon atoms. $R_4$ and $R_5$ are each preferably the hydrogen atom.

Specific examples and suitable aspects of the alkyl group substituted with at least one fluorine atom are the same as the specific examples and the suitable aspects, respectively, of Xf in General Formula (3).

L represents a divalent linking group, and in a case where a plurality of L's are present, they may be the same as or different from each other.

Examples of the divalent linking group include —COO— (—C(═O)—O—), —OCO—, —CONH—, —NHCO—, —CO—, —O—, —S—, —SO—, —$SO_2$—, an alkylene group (preferably having 1 to 6 carbon atoms), a cycloalkylene group (preferably having 3 to 15 carbon atoms), an alkenylene group (preferably having 2 to 6 carbon atoms), or a divalent linking group formed by combination of these plurality of groups. Among these, —COO—, —OCO—, —CONH—, —NHCO—, —CO—, —O—, —$SO_2$—, —COO-alkylene group-, —OCO-alkylene group-, —CONH-alkylene group-, or —NHCO-alkylene group- is preferable, and —COO—, —OCO—, —CONH—, —$SO_2$—, —COO-alkylene group-, or —OCO-alkylene group- is more preferable.

W represents an organic group.

The number of carbon atoms of the organic group is not particularly limited, but is generally 1 to 30, and preferably 1 to 20.

The organic group is not particularly limited, and represents, for example, an alkyl group, an alkoxy group, or the like.

The alkyl group is not particularly limited, but may be linear or branched, and is preferably an alkyl group having 1 to 10 carbon atoms, more preferably an alkyl group having 1 to 6 carbon atoms, and still more preferably an alkyl group having 1 to 4 carbon atoms.

The alkyl group and the alkoxy group may have a substituent. The substituent is not particularly limited, but examples thereof include the above-mentioned substituent T, and the fluorine atom is preferable.

W preferably represents an organic group including a cyclic structure. Among these, W is preferably a cyclic organic group.

Examples of the cyclic organic group include an alicyclic group, an aryl group, and a heterocyclic group.

The alicyclic group may be either monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable.

The aryl group may be monocyclic or polycyclic. Examples of the aryl group include a phenyl group, a naphthyl group, a phenanthryl group, and an anthryl group.

The heterocyclic group may be either monocyclic or polycyclic. The polycyclic heterocyclic group can further suppress acid diffusion. Furthermore, the heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring not having aromaticity include a tetrahydropyran ring, a lactone ring, a sultone ring, and a decahydroisoquinoline ring. Examples of the lactone ring and the sultone ring include the above-mentioned lactone structures and sultone structures exemplified in the resin. As the heterocyclic ring in the heterocyclic group, the furan ring, the thiophene ring, the pyridine ring, or the decahydroisoquinoline ring is particularly preferable.

The cyclic organic group may have a substituent. Examples of the substituent include an alkyl group (which may be either linear or branched, preferably having 1 to 12 carbon atoms), a cycloalkyl group (which may be any of a monocycle, a polycycle, and a spirocycle, and preferably has 3 to 20 carbon atoms), an aryl group (preferably having 6 to 14 carbon atoms), a hydroxyl group, an alkoxy group, an ester group, an amide group, a urethane group, a ureide group, a thioether group, a sulfonamide group, and a sulfonic acid ester group. Incidentally, the carbon constituting the cyclic organic group (carbon contributing to ring formation) may be carbonyl carbon.

As $Z^-$ in General Formula (ZI), $Z^-$ in General Formula (ZII), $Zc^-$ in General Formula (ZI-3), and $Z^-$ in General Formula (ZI-4), an anion represented by General Formula (An-2) or (An-3) is also preferable.

Formula An-2

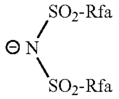

Formula An-3

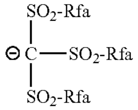

In General Formulae (An-2) and (An-3), Rfa's each independently represent a monovalent organic group having a fluorine atom, and a plurality of Rfa's may be bonded to each other to form a ring.

Rfa is preferably an alkyl group substituted with at least one fluorine atom. The alkyl group preferably has 1 to 10 carbon atoms, and more preferably has 1 to 4 carbon atoms. In addition, the alkyl group substituted with at least one fluorine atom is preferably a perfluoroalkyl group.

Preferred examples of the sulfonium cation in General Formula (ZI) and the sulfonium cation or the iodonium cation in General Formula (ZII) are shown below.

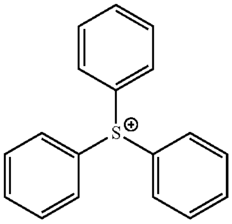
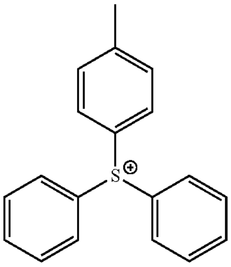
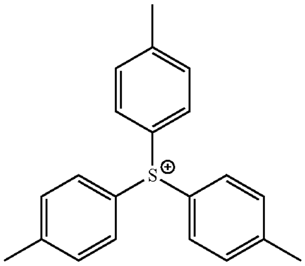
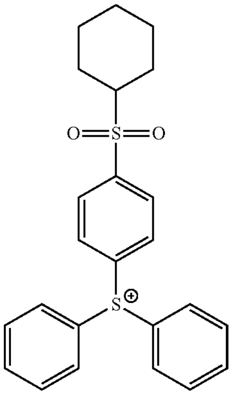
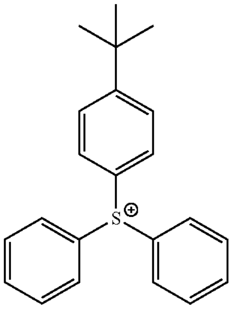

-continued

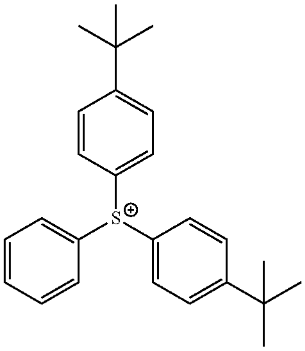
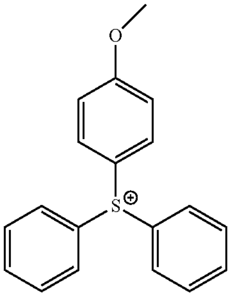
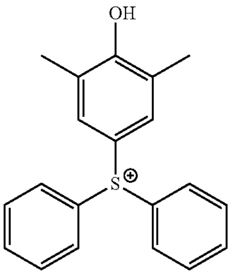
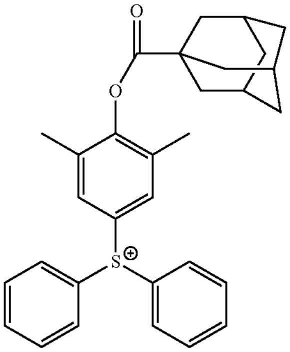
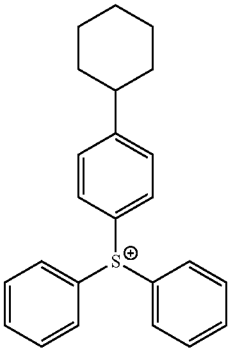
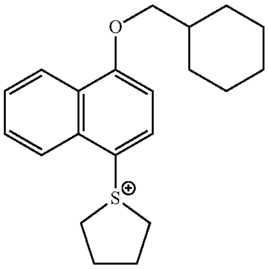
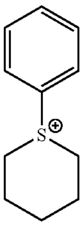
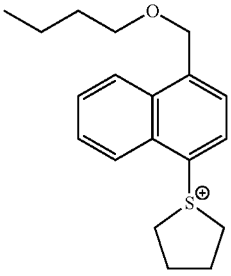

-continued
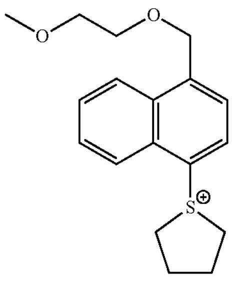
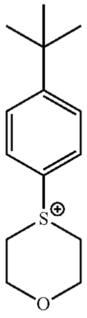
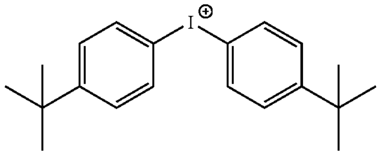
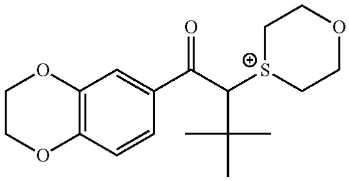
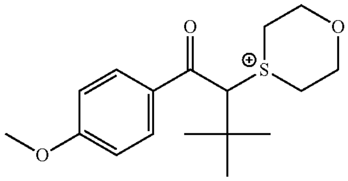
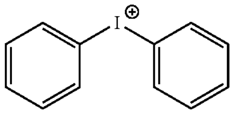 [SMILES: c1ccc([I+]c2ccccc2)cc1]
Preferred examples of the anion $Z^-$ in each of General Formula (ZI) and General Formula (ZII), $Zc^-$ in General Formula (ZI-3), and $Z^-$ in General Formula (ZI-4) are shown below.
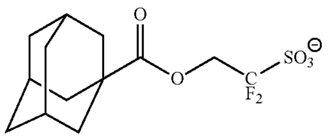
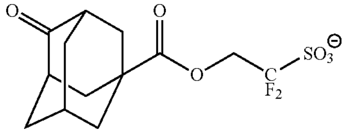
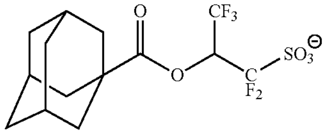
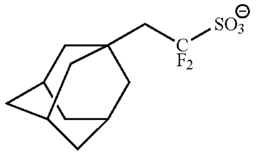
-continued
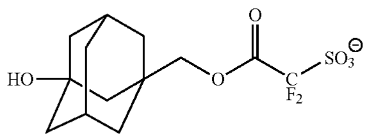
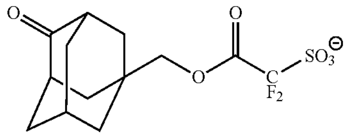
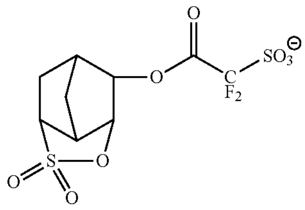
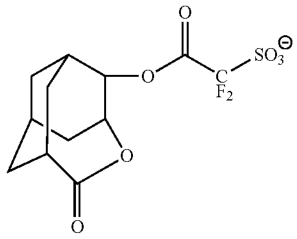
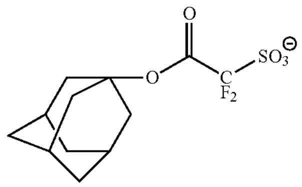
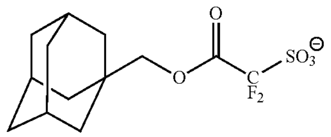
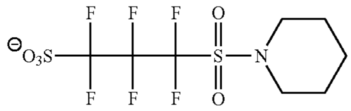
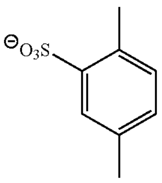
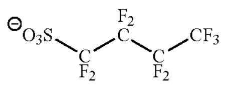
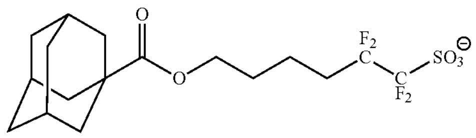
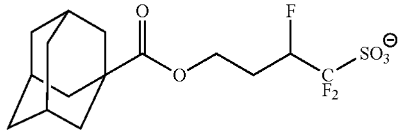

-continued

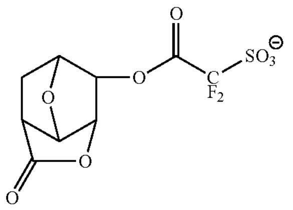

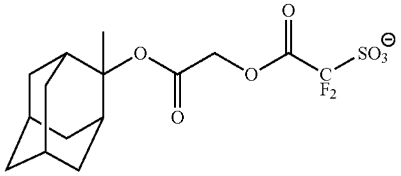

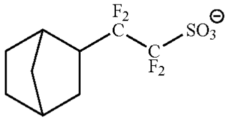

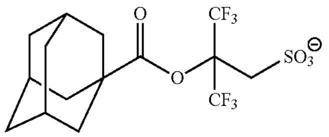

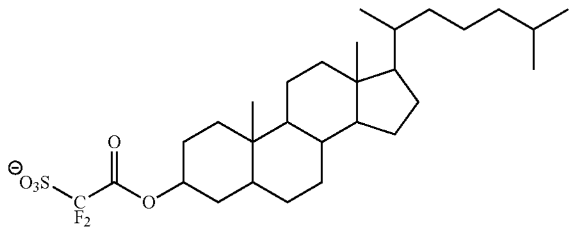

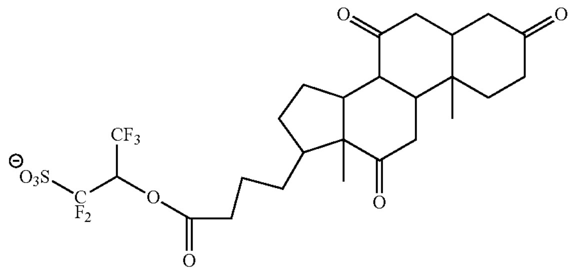

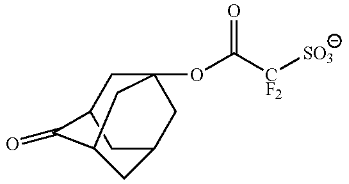

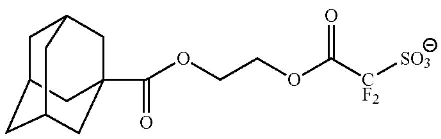

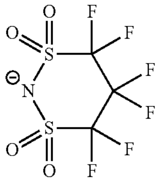

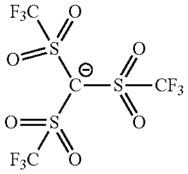

-continued

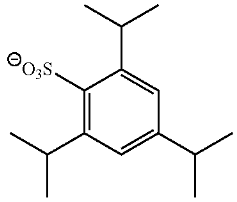

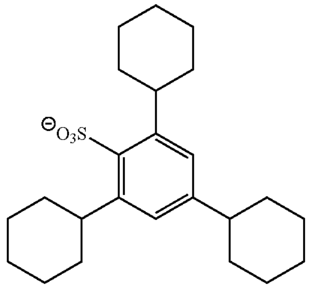

The mass-based content ratio of the photoacid generator (C) in the composition of the embodiment of the present invention is preferably 0.1% to 20% by mass, more preferably 0.5% to 15% by mass, and still more preferably 0.5% to 10% by mass.

The photoacid generators (C) may be used alone or in combination of two or more kinds thereof. In a case where two or more kinds of the photoacid generators (C) are used in combination, the total amount thereof is preferably within the range.

<Acid Diffusion Control Agent (D)>

The composition of the embodiment of the present invention preferably contains an acid diffusion control agent (also referred to as an "acid diffusion control agent (D)").

The acid diffusion control agent (D) acts as a quencher that suppresses a reaction of the resin (A) and the resin (B) (acid-decomposable resins) in the unexposed portion by excessive generated acids by trapping the acids generated from a photoacid generator (C) and the like upon exposure.

For example, as the acid diffusion control agent (D), a basic compound (DA), a basic compound (DB) having basicity reduced or lost upon irradiation with actinic rays or radiation, an onium salt (DC) which serves as a weak acid relative to a photoacid generator (C), a low-molecular-weight compound (DD) having a nitrogen atom and a group that leaves by the action of an acid, an onium salt compound (DE) having a nitrogen atom in a cationic moiety, and the like can be used.

As the acid diffusion control agent (D), a known acid diffusion control agent can be appropriately used. For example, the known compounds disclosed in paragraphs [0627] to [0664] of US2016/0070167A, paragraphs [0095] to [0187] of US2015/0004544A, paragraphs [0403] to [0423] of US2016/0237190A, and paragraphs [0259] to [0328] of US2016/0274458A can be suitably used as the acid diffusion control agent (D).

Examples of the basic compound (DA) include the compounds described in paragraphs 0188 to 0208 of JP2019-045864A.

In the present invention, the onium salt (DC) which serves as a weak acid relative to the photoacid generator (C) can be used as the acid diffusion control agent (D).

In a case where the photoacid generator (C) and the onium salt generating an acid that is a weak acid relative to an acid generated from the photoacid generator (C) are mixed and used, an acid generated from the photoacid generator (C)

upon irradiation with actinic rays or radiation produces an onium salt having a strong acid anion by discharging the weak acid through salt exchange in a case where the acid collides with an onium salt having an unreacted weak acid anion. It is considered that in this process, the strong acid is exchanged with a weak acid having a lower catalytic ability, and thus, the acid is apparently deactivated and the acid diffusion can be controlled.

Examples of the onium salt which serves as a weak acid relative to the photoacid generator (C) include the onium salts described in paragraphs 0224 to 0233 of JP2019-070676A.

As the basic compound (DA), compounds having structures represented by Formulae (A) to (E) are preferable.

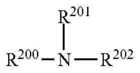
(A)

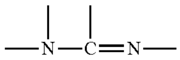
(B)

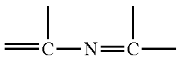
(C)

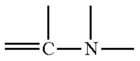
(D)

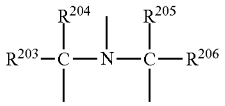
(E)

In General Formulae (A) and (E), $R^{200}$, $R^{201}$, and $R^{202}$ may be the same as or different from each other, and each independently represent a hydrogen atom, an alkyl group (preferably having 1 to 20 carbon atoms), a cycloalkyl group (preferably having 3 to 20 carbon atoms), an aryl group (preferably having 6 to 20 carbon atoms), an alkylcarbonyl group (preferably 2 to 21 carbon atoms), a cycloalkylcarbonyl group (preferably 4 to 21 carbon atoms), an arylcarbonyl group (preferably 7 to 21 carbon atoms), an alkylsulfonyl group (preferably having 1 to 20 carbon atoms), a cycloalkylsulfonyl group (preferably having 3 to 20 carbon atoms), or an arylsulfonyl group (preferably having 6 to 20 carbon atoms). At least two of $R^{200}$, $R^{201}$, or $R^{202}$ may be bonded to form a ring, and at least one of an oxygen atom, a sulfur atom, an ester bond, an amide bond, a carbonyl group, or a sulfonyl group may be included in the ring.

$R^{203}$, $R^{204}$, $R^{205}$, and $R^{206}$ may be the same as or different from each other and each independently represent an alkyl group having 1 to 20 carbon atoms.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl group in each of General Formulae (A) and (E) are more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

The basic compound (DB) having basicity reduced or lost upon irradiation with actinic rays or radiation (hereinafter also referred to as a "compound (DB)") is a compound which has a proton-accepting functional group, and decomposes under irradiation with actinic rays or radiation to exhibit reduced or lost proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

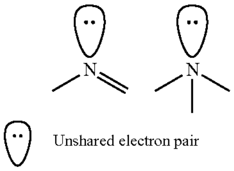

Preferred examples of the partial structure of the proton-accepting functional group include crown ether, azacrown ether, primary to tertiary amine, pyridine, imidazole, and pyrazine structures.

The compound (DB) decomposes upon irradiation with actinic rays or radiation to generate a compound exhibiting reduced or lost proton-accepting properties, or a change from the proton-accepting properties to acidic properties. Here, exhibiting reduced or lost proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

The acid dissociation constant pKa of the compound generated by decomposition of the compound (DB) upon irradiation with actinic rays or radiation preferably satisfies $pKa<-1$, more preferably satisfies $-13<pKa<-1$, and still more preferably satisfies $13<pKa<-3$.

The acid dissociation constant pKa refers to an acid dissociation constant pKa in an aqueous solution, and is defined, for example, in Chemical Handbook (II) (Revised 4th Edition, 1993, compiled by the Chemical Society of Japan, Maruzen Company, Ltd.). A lower value of the acid dissociation constant pKa indicates a higher acid strength. Specifically, the acid dissociation constant pKa in an aqueous solution can be actually measured by using an infinite-dilution aqueous solution and measuring the acid dissociation constant at 25° C. Alternatively, the acid dissociation constant pKa can also be determined using the following software package 1 by computation from a value based on a Hammett's substituent constant and the database of publicly known literature values. Any of the pKa values described in the present specification indicate values determined by computation using the software package.

Software Package 1: Advanced Chemistry Development (ACD/Labs) Software V 8.14 for Solaris (1994-2007 ACD/Labs).

In the composition of the embodiment of the present invention, the onium salt (DC) which is a weak acid relative to an acid generator can be used as the acid diffusion control agent.

In a case where the acid generator and the onium salt that generates an acid which is a weak acid relative to an acid generated from the acid generator are mixed and used, an acid generated from the acid generator upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic activity, and thus, the acid is apparently deactivated and the acid diffusion can be controlled.

As the onium salt which is a weak acid relative to the acid generator, compounds represented by General Formulae (d1-1) to (d1-3) are preferable.

(d1-1)

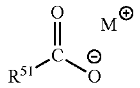

(d1-2)

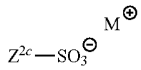

(d1-3)

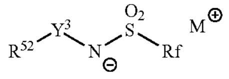

In the formula, $R^{51}$ is a hydrocarbon group which may have a substituent, $Z^{2c}$ is a hydrocarbon group having 1 to 30 carbon atoms, which may have a substituent (provided that carbon adjacent to S is not substituted with a fluorine atom), $R^{52}$ is an organic group, $Y^3$ is a linear, branched, or cyclic alkylene group or an arylene group, Rf is a hydrocarbon group including a fluorine atom, and $M^+$'s are each independently an ammonium cation, a sulfonium cation, or an iodonium cation.

Preferred examples of the sulfonium cation or iodonium cation represented by $M^+$ include the sulfonium cation exemplified for General Formula (ZI) and the iodonium cation exemplified for General Formula (ZII).

The onium salt (DC) which is a weak acid relative to an acid generator may be a compound having a cationic site and an anionic site in the same molecule, in which the cationic site and the anionic site are linked by a covalent bond (hereinafter also referred to as a "compound (DCA)").

As the compound (DCA), a compound represented by any of General Formulae (C-1) to (C-3) is preferable.

(C-1)

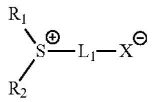

-continued (C-2)

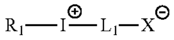

(C-3)

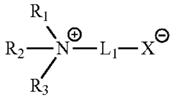

In General Formulae (C-1) to (C-3), $R_1$, $R_2$, and $R_3$ each independently represent a substituent having 1 or more carbon atoms.

$L_1$ represents a divalent linking group that links a cationic site with an anionic site, or a single bond.

—$X^-$ represents an anionic site selected from —$COO^-$, —$SO_3^-$, —$SO_2^-$, and —$N^-$—$R_4$. $R_4$ represents at least one of a monovalent substituent having a carbonyl group: —C(═O)—, a sulfonyl group: —S(═O)$_2$—, or a sulfinyl group: —S(═O)— at a site for linking to an adjacent N atom.

$R_1$, $R_2$, $R_3$, $R_4$, and $L_1$ may be bonded to each other to form a ring structure. In addition, in General Formula (C-3), two of $R_1$ to $R_3$ are combined with each other to represent one divalent substituent, and may be bonded to an N atom through a double bond.

Examples of the substituent having 1 or more carbon atoms in each of $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. The alkyl group, a cycloalkyl group, or the aryl group is preferable.

Examples of $L_1$ as a divalent linking group include a linear or branched alkylene group, a cycloalkylene group, an arylene group, a carbonyl group, an ether bond, an ester bond, an amide bond, a urethane bond, a urea bond, and a group formed by combination of two or more kinds of these groups. $L_1$ is preferably the alkylene group, the arylene group, the ether bond, the ester bond, and the group formed by combination of two or more kinds of these groups.

The low-molecular-weight compound (DD) having a nitrogen atom and having a group that leaves by the action of an acid (hereinafter also referred to as a "compound (DD)") is preferably an amine derivative having a group that leaves by the action of an acid on the nitrogen atom.

As the group that leaves by the action of an acid, an acetal group, a carbonate group, a carbamate group, a tertiary ester group, a tertiary hydroxyl group, or a hemiaminal ether group is preferable, and the carbamate group or the hemiaminal ether group is more preferable.

The molecular weight of the compound (DD) is preferably 100 to 1,000, more preferably 100 to 700, and still more preferably 100 to 500.

The compound (DD) may have a carbamate group having a protective group on the nitrogen atom. The protective group constituting the carbamate group can be represented by General Formula (d-1).

(d-1)

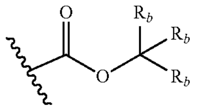

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, the cycloalkyl group, the aryl group, or the aralkyl group represented by $R_b$ may be each independently substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by $R_b$.

As $R_b$, a linear or branched alkyl group, a cycloalkyl group, or an aryl group is preferable, and the linear or branched alkyl group, or the cycloalkyl group is more preferable.

Examples of the ring formed by the mutual linkage of two $R_b$'s include an alicyclic hydrocarbon, an aromatic hydrocarbon, a heterocyclic hydrocarbon, and derivatives thereof.

Examples of the specific structure of the group represented by General Formula (d-1) include, but are not limited to, the structures disclosed in paragraph [0466] of US2012/0135348A1.

The compound (DD) preferably has a structure represented by General Formula (6).

(6)

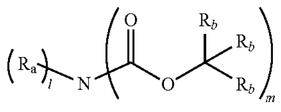

In General Formula (6), l represents an integer of 0 to 2, m represents an integer of 1 to 3, and these satisfy l+m=3.

$R_a$ represents a hydrogen atom, an alkyl group, a cycloalkyl group, an aryl group, or an aralkyl group. In a case where l is 2, two $R_a$'s may be the same as or different from each other, and the two $R_a$'s may be linked to each other to form a heterocyclic ring with the nitrogen atom in the formula. This heterocyclic ring may include a heteroatom other than the nitrogen atom in the formula.

$R_b$ has the same definition as $R_b$ in General Formula (d-1), and preferred examples are also the same.

In General Formula (6), the alkyl group, the cycloalkyl group, the aryl group, and the aralkyl group as $R_a$ may be each independently substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (these groups may be substituted with the groups) of $R_a$ include the same groups as the specific examples described above with respect to $R_b$.

Specific structures of the particularly preferred compound (DD) in the present invention include, but are not limited to, the compounds disclosed in paragraph [0475] of the specification of US2012/0135348A1.

The onium salt compound (DE) having a nitrogen atom in a cationic moiety (hereinafter also referred to as a "compound (DE)") is preferably a compound having a basic site including a nitrogen atom in the cationic moiety. The basic site is preferably an amino group, and more preferably an aliphatic amino group. All of the atoms adjacent to the nitrogen atom in the basic site are still more preferably hydrogen atoms or carbon atoms. In addition, from the viewpoint of improving basicity, it is preferable that an electron-withdrawing functional group (such as a carbonyl group, a sulfonyl group, a cyano group, and a halogen atom) is not directly linked to the nitrogen atom.

Preferred specific structures of the compound (DE) include, but are not limited to, the compounds disclosed in paragraph [0203] of US2015/0309408A1.

The content ratio of the acid diffusion control agent (D) (in a case where a plurality of kinds of the acid diffusion control agents are present, a total content thereof) in the composition of the embodiment of the present invention is preferably 0.01% to 10.0% by mass, and more preferably 0.01% to 5.0% by mass with respect to the total solid content of the composition of the embodiment of the present invention.

In the present invention, the acid diffusion control agent (D) may be used alone or in combination of two or more kinds thereof.

<Solvent>

The composition of the embodiment of the present invention preferably contains a solvent (also referred to as a "solvent (S)").

The solvent (S) preferably includes at least one solvent of (M1) propylene glycol monoalkyl ether carboxylate, or (M2) at least one selected from the group consisting of a propylene glycol monoalkyl ether, a lactic acid ester, an acetic acid ester, an alkoxypropionic acid ester, a chain ketone, a cyclic ketone, a lactone, and an alkylene carbonate as a solvent. The solvent in this case may further include components other than the components (M1) and (M2).

In a case where the solvent including the component (M1) or (M2) is used in combination with the above-mentioned resins (A) and (B), the coatability of the actinic ray-sensitive or radiation-sensitive resin composition is improved, and further, a pattern having a small number of development defects can be formed, which is thus preferable.

In addition, examples of the solvent (S) include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may include a ring, alkylene carbonate, alkyl alkoxyacetate, and alkyl pyruvate.

The content ratio of the solvent (S) in the composition of the embodiment of the present invention is preferably adjusted so that the concentration of solid contents of the composition of the embodiment of the present invention is 0.5% to 40% by mass, and more preferably adjusted so that the concentration of solid contents of the composition of the embodiment of the present invention is 3% to 30% by mass. In particular, from the viewpoint that the effect of the present invention is more excellent, the concentration of solid contents of the composition of the embodiment of the present invention is preferably 10% by mass or more, and particularly preferably 10% to 30% by mass. Furthermore, the concentration of solid contents means a mass percentage of the mass of other components (components which can constitute an actinic ray-sensitive or radiation-sensitive film) excluding the solvent with respect to the total mass of the actinic ray-sensitive or radiation-sensitive resin composition.

<Surfactant>

The composition of the embodiment of the present invention can include a surfactant (also referred to as a "surfactant (E)"). By incorporating a surfactant into the composition of the embodiment of the present invention, the adhesiveness is more excellent and a pattern having reduced development defects can be obtained.

As the surfactant (E), fluorine-based and/or silicon-based surfactants are preferable.

Examples of the fluorine-based and/or silicon-based surfactant include the surfactants described in paragraph 0276 of the specification of US2008/0248425A. In addition, EFTOP EF301 or EF303 (manufactured by Shin-Akita Chemical Co., Ltd.); FLUORAD FC430, 431, or 4430 (manufactured by Sumitomo 3M Inc.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); KH-20 (manufactured by Asahi Kasei Corporation); or FTX-204G, 208G, 218G, 230G, 204D, 208D, 212D, 218D, or 222D (manufactured by NEOS Co., Ltd.) may be used. In addition, a polysiloxane polymer, KP-341 (manufactured by Shin-Etsu Chemical Co., Ltd.), can also be used as the silicon-based surfactant.

Moreover, the surfactant (E) may be synthesized using a fluoroaliphatic compound manufactured using a telomerization method (also referred to as a telomer method) or an oligomerization method (also referred to as an oligomer method), in addition to the known surfactants as shown above. Specifically, a polymer including a fluoroaliphatic group derived from fluoroaliphatic compound may be used as the surfactant. This fluoroaliphatic compound can be synthesized, for example, by the method described in JP2002-90991A.

As the polymer having a fluoroaliphatic group, a copolymer of a monomer having a fluoroaliphatic group and (poly(oxyalkylene))acrylate and/or (poly(oxyalkylene)) methacrylate is preferable, and the polymer may be unevenly distributed or block-copolymerized. Furthermore, examples of the poly(oxyalkylene) group include a poly (oxyethylene) group, a poly(oxypropylene) group, and a poly(oxybutylene) group, and the group may also be a unit such as those having alkylenes having different chain lengths within the same chain length such as poly(block-linked oxyethylene, oxypropylene, and oxyethylene) and poly(block-linked oxyethylene and oxypropylene). In addition, the copolymer of a monomer having a fluoroaliphatic group and (poly(oxyalkylene))acrylate (or methacrylate) is not limited only to a binary copolymer but may also be a ternary or higher copolymer obtained by simultaneously copolymerizing monomers having two or more different fluoroaliphatic groups or two or more different (poly(oxyalkylene)) acrylates (or methacrylates).

Examples of a commercially available surfactant thereof include MEGAFACE F-178, F-470, F-473, F-475, F-476, and F-472 (manufactured by DIC Corporation), a copolymer of acrylate (or methacrylate) having a $C_6F_{13}$ group and (poly(oxyalkylene))acrylate (or methacrylate), and a copolymer of acrylate (or methacrylate) having a $C_3F_7$ group, (poly(oxyethylene))acrylate (or methacrylate), and (poly (oxypropylene))acrylate (or methacrylate).

In addition, a surfactant other than the fluorine-based surfactant and/or the silicon-based surfactants described in paragraph [0280] of US2008/0248425A may be used.

The surfactant (E) may be used alone or in combination of two or more kinds thereof.

The composition of the embodiment of the present invention may or may not contain the surfactant (E), but in a case where the composition of the embodiment of the present invention contains the surfactant (E), the content of the surfactant (E) is preferably 0.0001% to 2% by mass, and more preferably 0.0005% to 1% by mass with respect to the total solid content of the composition of the embodiment of the present invention.

<Hydrophobic Resin>

The composition of the embodiment of the present invention can include a hydrophobic resin (also referred to as a "hydrophobic resin (F)").

The hydrophobic resin (F) is a hydrophobic resin which is different from the above-mentioned resins (A) and (B).

Although it is preferable that the hydrophobic resin (F) is designed to be unevenly distributed on a surface of the resist film, it does not necessarily need to have a hydrophilic group in the molecule as different from the surfactant, and does not need to contribute to uniform mixing of polar materials and non-polar materials.

Examples of the effect of addition of the hydrophobic resin (F) include a control of static and dynamic contact angles of a surface of the resist film with respect to water and suppression of out gas.

The hydrophobic resin (F) preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds thereof. In addition, the hydrophobic resin (F) preferably has a hydrocarbon group having 5 or more carbon atoms. These groups may be contained in the main chain of the resin or may be substituted in a side chain.

In a case where hydrophobic resin (F) includes a fluorine atom and/or a silicon atom, the fluorine atom and/or the silicon atom in the hydrophobic resin may be included in the main chain or a side chain of the resin.

In a case where the hydrophobic resin (F) contains a fluorine atom, as a partial structure having a fluorine atom, an alkyl group having a fluorine atom, a cycloalkyl group having a fluorine atom, or an aryl group having a fluorine atom is preferable.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and the alkyl group may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

Examples of the aryl group having a fluorine atom include an aryl group such as a phenyl group and a naphthyl group, in which at least one hydrogen atom is substituted with a fluorine atom, and the aryl group may further have a substituent other than a fluorine atom.

Examples of the repeating unit having a fluorine atom or a silicon atom include those exemplified in paragraph 0519 of US2012/0251948A.

In addition, as described above, it is also preferable that the hydrophobic resin (F) contains a $CH_3$ partial structure in a side chain moiety.

Here, the $CH_3$ partial structure contained in the side chain moiety in the hydrophobic resin includes a $CH_3$ partial structure contained in an ethyl group, a propyl group, and the like.

On the other hand, a methyl group bonded directly to the main chain of the hydrophobic resin (F) (for example, an α-methyl group in the repeating unit having a methacrylic acid structure) makes only a small contribution to uneven distribution on the surface of the hydrophobic resin (F) due to the effect of the main chain, and it is therefore not included in the $CH_3$ partial structure in the present invention.

With regard to the hydrophobic resin (F), reference can be made to the description in paragraphs 0348 to 0415 of JP2014-010245A, the contents of which are incorporated herein by reference.

Furthermore, the resins described in JP2011-248019A, JP2010-175859A, and JP2012-032544A can also be preferably used as the hydrophobic resin (F).

The composition of the embodiment of the present invention may or may not contain the hydrophobic resin (F), but in a case where the composition of the embodiment of the present invention contains the hydrophobic resin (F), the content ratio of the hydrophobic resin (F) is preferably 0.01% to 20% by mass, and more preferably 0.1% to 15% by mass with respect to the total solid content of the composition of the embodiment of the present invention.

<Other Components>

The composition of the embodiment of the present invention may contain other components other than the above-mentioned components. Examples of such other components include a crosslinking agent, an alkali-soluble resin, a dissolution inhibiting compound, a dye, a plasticizer, a photosensitizer, a light absorber, and a compound that accelerates solubility in a developer.

<Viscosity>

The viscosity of the composition of the embodiment of the present invention is not particularly limited, but is preferably 10 to 100 mPa·s, more preferably 15 to 90 mPa·s, and still more preferably 30 to 70 mPa·s at 25° C. The viscosity of the actinic ray-sensitive or radiation-sensitive resin composition is determined by measuring with an E-type viscometer (RE-85L type, manufactured by Toki Sangyo Co., Ltd.) at 25° C.

<Preparation Method>

The composition of the embodiment of the present invention can be prepared by dissolving the above-mentioned resins (A) and (B), and as necessary, each of the above-mentioned components in a solvent (preferably the above-mentioned solvent), and filtering the same.

The pore size of a filter for use in filtration using a filter is not particularly limited, but is preferably 3 μm or less, more preferably 0.5 μm or less, and still more preferably 0.3 μm or less. In addition, in some cases, the pore size of the filter is also preferably 0.1 μm or less, preferably 0.05 μm or less, and preferably 0.03 μm or less. The filter is preferably a polytetrafluoroethylene-, polyethylene-, or nylon-made filter. In the filtration using a filter, for example, as disclosed in JP2002-62667A, circulation-filtration may be performed or the filtration may be performed by connection of a plurality of kinds of filters in series or in parallel. In addition, the composition may be filtered in plural times. Furthermore, the composition may be subjected to a deaeration treatment or the like before or after filtration using a filter.

<Uses>

The composition of the embodiment of the present invention undergoes a reaction upon irradiation with actinic rays or radiation to change the properties. The composition of the embodiment of the present invention can be used in a step of manufacturing a semiconductor such as an integrated circuit (IC), for the manufacture of a circuit board for a liquid crystal, a thermal head, or the like, the manufacture of a mold structure for imprinting, other photofabrication steps, production of a planographic printing plate or an acid-curable composition, and the like. A pattern formed using the composition of the embodiment of the present invention can be used in an etching step, an ion implantation step, a bump electrode forming step, a rewiring forming step, microelectromechanical systems (MEMS), or the like.

[Pattern Forming Method and Resist Film]

The pattern forming method of an embodiment of the present invention has:

a step of forming a resist film on a substrate, using the actinic ray-sensitive or radiation-sensitive resin composition of the embodiment of the present invention, a step of exposing the resist film to obtain an exposed resist film, a step of developing the exposed resist film, using a developer to form a pattern.

Hereinafter, each step will be described in detail.

(Step a: Resist Film Forming Step)

The step a is a step of forming a resist film on a substrate, using the composition of the embodiment of the present invention.

Examples of a method in which a resist film is formed on a substrate, using the composition of the embodiment of the present invention, include a method in which the composition of the embodiment of the present invention is applied onto a substrate.

The composition of the embodiment of the present invention can be applied onto a substrate (for example, silicon and silicon dioxide coating) as used in the manufacture of integrated circuit elements by a suitable application method such as ones using a spinner or a coater. As the application method, spin application using a spinner is preferable.

After applying the composition of the embodiment of the present invention, the substrate may be dried to form a resist film. Furthermore, various underlying films (an inorganic film, an organic film, or an antireflection film) may be formed on the underlayer of the resist film, as desired.

Examples of the drying method include a heating method (pre-baking: PB). The heating may be performed using a unit included in an ordinary exposure machine and/or an ordinary development machine, and may also be performed using a hot plate or the like.

The heating temperature is preferably 80° C. to 150° C., and more preferably 80° C. to 140° C.

The heating time is preferably 30 to 1,000 seconds, and more preferably 40 to 800 seconds.

The film thickness of the resist film is not particularly limited.

In a case where the resist film is a resist film for KrF exposure, the film thickness is preferably 500 nm or more, more preferably from 800 nm to 12 μm, and still more preferably from 1 μm to 6 μm.

In a case where the resist film is a resist film for ArF exposure or EUV exposure, the film thickness is preferably 10 to 700 nm, and more preferably 20 to 400 nm.

The present invention also relates to a resist film formed using the composition of the embodiment of the present invention. In a case where the film thickness of the resist film is 500 nm or more, the effect of the present invention that a pattern having an excellent CDU can be formed is remarkably exhibited.

A topcoat may be formed on the upper layer of the resist film, using the topcoat composition.

It is preferable that the topcoat composition is not mixed with the resist film and can be uniformly applied onto the upper layer of the resist film.

The film thickness of the topcoat is preferably 10 to 200 nm, and more preferably 20 to 100 nm.

The topcoat is not particularly limited, a topcoat known in the related art can be formed by a method known in the related art, and for example, the topcoat can be formed in accordance with the description in paragraphs 0072 to 0082 of JP2014-059543A.

(Step b: Exposing Step)

The step b is a step of exposing the resist film to obtain an exposed resist film.

Examples of the exposure method include a method in which a mask is disposed between a light source and the resist film, and a method which the resist film is directly irradiated with actinic rays or radiation without disposing a mask.

Examples of the actinic rays or the radiation include infrared light, visible light, ultraviolet light, far ultraviolet light, extreme ultraviolet light, X-rays, and electron beams (EB); and a KrF excimer laser (248 nm), an ArF excimer laser (193 nm), an $F_2$ excimer laser (157 nm), the EUV (13 nm), the X-rays, and the EB are preferable.

The light source for the exposure of the step b is particularly preferably KrF.

It is preferable to perform baking (post-exposure bake: PEB) after exposure and before development.

The heating temperature is preferably 80° C. to 150° C., and more preferably 80° C. to 140° C.

The heating time is preferably 10 to 1,000 seconds, and more preferably 10 to 180 seconds.

The heating may be performed using a unit included in an ordinary exposure machine and/or an ordinary development machine, and may also be performed using a hot plate or the like.

This step is also described as a post-exposure baking.

(Step c: Developing Step)

The step c is a step of developing the exposed resist film using a developer to form a pattern.

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate rotating at a constant rate while scanning a developer jetting nozzle at a constant rate (a dynamic dispense method).

In addition, after the step of performing development, a step of stopping the development may be carried out while substituting the solvent with another solvent.

A developing time is not particularly limited as long as it is a period of time where the unexposed portion of a resin is sufficiently dissolved, and is preferably 10 to 300 seconds, and more preferably 20 to 120 seconds.

The temperature of the developer is preferably 0° C. to 50° C., and more preferably 15° C. to 35° C.

Examples of the developer include an alkali developer and an organic solvent developer.

As the alkali developer, it is preferable to use an aqueous alkali solution including an alkali. Among those, the aqueous solutions of the quaternary ammonium salts typified by tetramethylammonium hydroxide (TMAH) are preferable as the alkali developer. An appropriate amount of an alcohol, a surfactant, or the like may be added to the alkali developer. The alkali concentration of the alkali developer is usually 0.1% to 20% by mass. Furthermore, the pH of the alkali developer is usually 10.0 to 15.0.

The organic solvent developer is a developer including an organic solvent.

Examples of the organic solvent used in the organic solvent developer include known organic solvents, and include an ester-based solvent, a ketone-based solvent, an alcohol-based solvent, an amide-based solvent, an ether-based solvent, and a hydrocarbon-based solvent.

(Other Steps)

The pattern forming method of the embodiment of the present invention can include a step of performing cleaning using a rinsing liquid after the step c.

Examples of the rinsing liquid used in the rinsing step after the step of performing development using an alkali developer include pure water. Furthermore, an appropriate amount of a surfactant may be added to the rinsing liquid.

The rinsing liquid used in the rinsing step after the developing step with an organic developer is not particularly limited as long as the rinsing liquid does not dissolve a resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used. Furthermore, an appropriate amount of a surfactant may be added to the rinsing liquid.

In addition, an etching treatment on the substrate may be carried out using a pattern thus formed as a mask. That is, the substrate (or the underlayer film and the substrate) may be processed using the pattern thus formed in the step c as a mask to form a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern thus formed in the step c as a mask is preferable.

The dry etching may be one-stage etching or multi-stage etching. In a case where the etching is etching including a plurality of stages, the etchings at the respective stages may be the same treatment or different treatments.

For etching, any of known methods can be used, and various conditions and the like are appropriately determined according to the type of a substrate, usage, and the like. Etching can be carried out, for example, in accordance with Journal of The International Society for Optical Engineering (Proc. of SPIE), Vol. 6924, 692420 (2008), JP2009-267112A, and the like. In addition, the etching can also be carried out in accordance with the method described in "Chapter 4 Etching" in "Semiconductor Process Text Book, 4th Ed., published in 2007, publisher: SEMI Japan".

Oxygen plasma etching is preferable as the dry etching.

It is preferable that various materials (for example, a solvent, a developer, a rinsing liquid, a composition for forming an antireflection film, and a composition for forming a topcoat) used in the present invention do not include impurities such as metals. The content of the impurities included in these materials is preferably 1 part per million (ppm) by mass or less, more preferably 10 parts per billion (ppb) by mass or less, still more preferably 100 parts per trillion (ppt) by mass or less, particularly preferably 10 ppt by mass or less, and most preferably 1 ppt by mass or less. Here, examples of the metal impurities include Na, K, Ca, Fe, Cu, Mn, Mg, Al, Li, Cr, Ni, Sn, Ag, As, Au, Ba, Cd, Co, Mo, Zr, Pb, Ti, V, W, and Zn.

Examples of a method for removing impurities such as metals from the various materials include filtration using a filter. A pore diameter of the filter is preferably 0.20 μm or less, more preferably 0.05 μm or less, and still more preferably 0.01 μm or less.

As a material of the filter, a fluorine resin such as polytetrafluoroethylene (PTFE) and perfluoroalkoxy alkane (PFA), a polyolefin resin such as polypropylene and polyethylene, and a polyamide resin such as nylon 6 and nylon 66 are preferable. As the filter, a filter which has been washed with an organic solvent in advance may be used. In the step of filtration using a filter, a plurality of filters or a plurality of kinds of filters connected in series or in parallel may be used. In a case of using the plurality of kinds of filters, a combination of filters having different pore diameters and/or materials may be used. In addition, various materials may be filtered plural times, and the step of filtering plural times may be a circulation-filtration step. As the circulation-filtration step, for example, the method disclosed in JP2002-62667A is preferable.

As the filter, a filter having a reduced amount of elutes as disclosed in JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, or organic adsorbing materials such as activated carbon can be used. Examples of the metal adsorbent include those disclosed in the specification of JP2016-206500A.

In addition, examples of a method for reducing the impurities such as metals included in various materials include a method in which a raw material having a low metal content is selected as a raw material constituting various materials and the raw material constituting the various materials is subjected to filtration using a filter; and a method in which distillation and the like are performed under conditions suppressing contamination as much as possible by performing a lining or coating with a fluorine resin and the like in the inside of a device. Preferred conditions for the filtration using a filter performed on the raw materials constituting various materials are the same ones as the above-mentioned conditions.

In order to prevent impurities from being incorporated, it is preferable that various materials are stored in the container described in the specification of US2015/0227049A, JP2015-123351A, JP2017-13804A, or the like.

Various materials may be used after being diluted with the solvent used in the composition.

In addition, the present invention further relates to a method for manufacturing an electronic device, including the above-mentioned pattern forming method.

The electronic device of an embodiment of the present invention is suitably mounted on electric and electronic equipment (for example, home appliances, office automation (OA)-related equipment, media-related equipment, optical equipment, telecommunication equipment, and the like).

EXAMPLES

Hereinbelow, the present invention will be described in more detail with reference to Examples. The materials, the amounts of materials used, the proportions, the treatment details, the treatment procedure, and the like shown in Examples below may be modified as appropriate as long as the modifications do not depart from the spirit of the present invention. The scope of the present invention should not be construed as being limited to the Examples shown below.

<Resin (A) and Resin (B)>

The following acid-decomposable resins were used as the resin (A) and the resin (B).

The number-average molecular weight (Mn), the weight-average molecular weight (Mw), the Z-average molecular weight (Mz), and the molecular weight distribution (Mw/Mn) of each resin were measured by the above-mentioned methods. In addition, the compositional ratios (unit: % by mole) of the repeating units in each resin were measured by means of $^{13}C$-nuclear magnetic resonance (NMR).

P-1

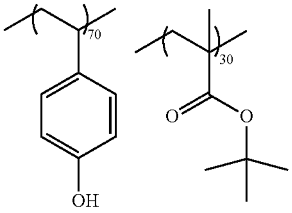

Mw=20800

Mw / Mn=1.41

Mz=35000

P-2

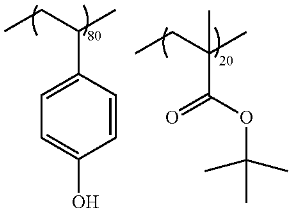

Mw=22000

Mw / Mn=1.53

Mz=37000

P-3

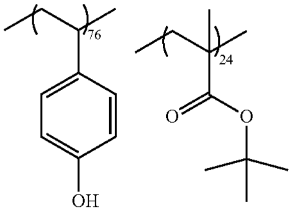

Mw=21000

Mw / Mn=1.46

Mz=35000

P-4

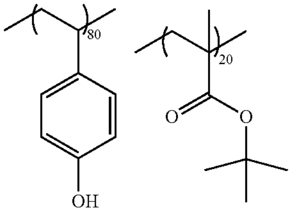

Mw=20700

Mw / Mn=1.47

Mz=35500

P-5

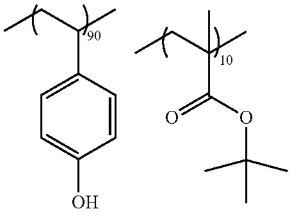

Mw=25500

Mw / Mn=1.36

Mz=34500

-continued
P-6
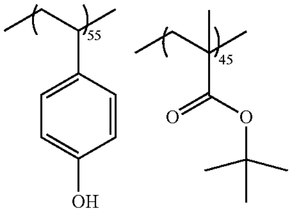
Mw=21000
Mw / Mn=1.45
Mz=36500
P-7
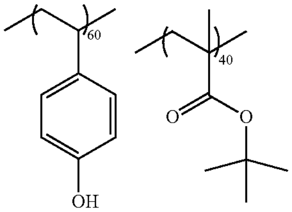
Mw=21400
Mw / Mn=1.75
Mz=36500
P-8
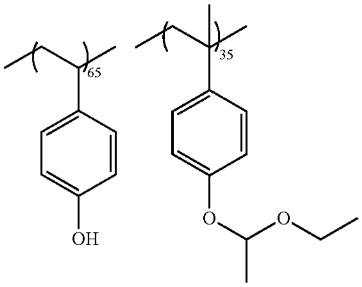
Mw=12000
Mw / Mn=1.54
Mz=29500
P-9
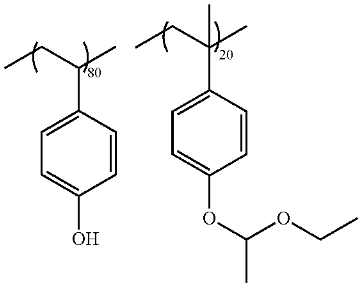
Mw=12500
Mw / Mn=1.47
Mz=30000
P-10
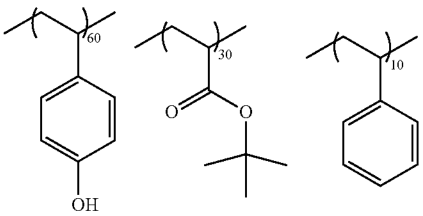
Mw=22000
Mw / Mn=1.35
Mz=35000
P-11
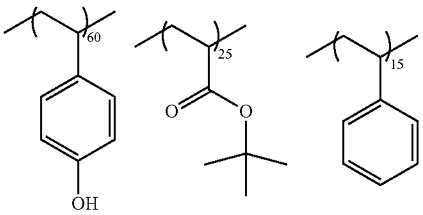
Mw=22500
Mw / Mn=1.40
Mz=36000
-continued
P-12
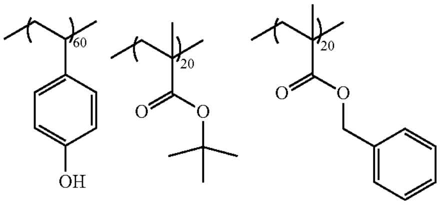
Mw=22000
Mw / Mn=1.35
Mz=35000
P-13
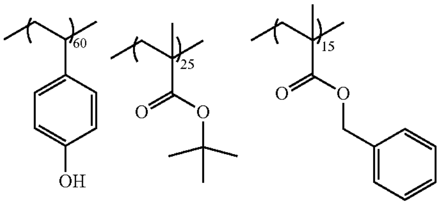
Mw=22500
Mw / Mn=1.40
Mz=36000
P-14
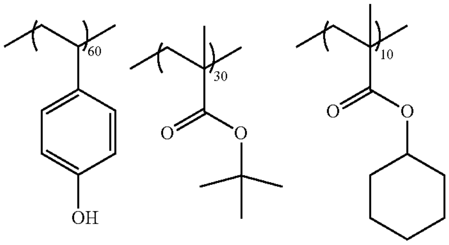
Mw=22000
Mw / Mn=1.35
Mz=35000
P-15
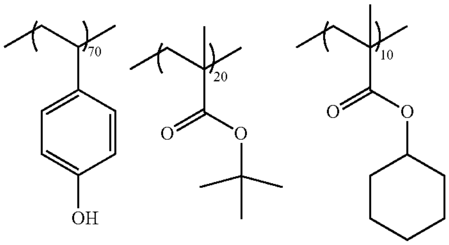
Mw=22500
Mw / Mn=1.40
Mz=36000
P-16
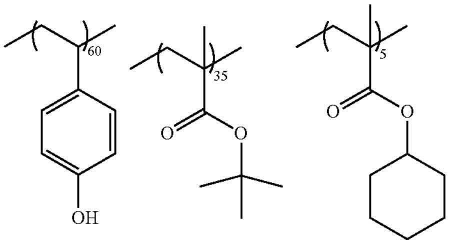
Mw=22000
Mw / Mn=1.35
Mz=35000
P-17
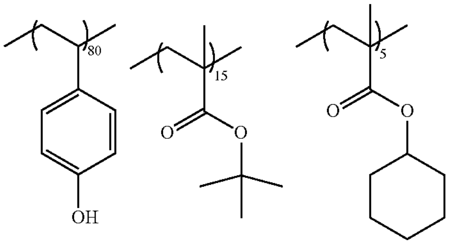
Mw=22500
Mw / Mn=1.40
Mz=36000

-continued
P-18
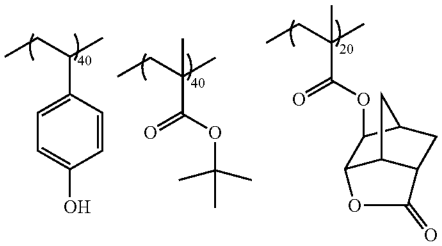
Mw=9000
Mw / Mn=1.60
Mz=24000
P-19
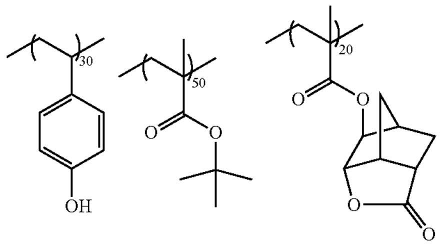
Mw=10000
Mw / Mn=1.52
Mz=22000
P-20
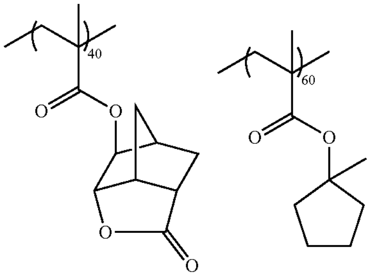
Mw=88000
Mw / Mn=1.61
Mz=19000
P-21
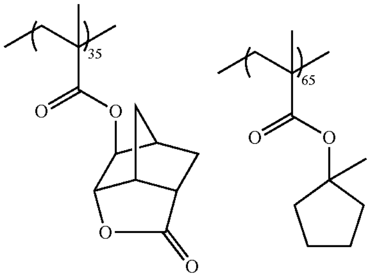
Mw=9100
Mw / Mn=1.51
Mz=19000
P-22
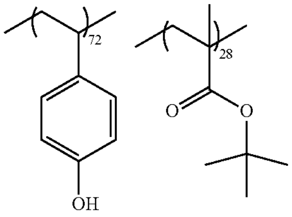
Mw=21000
Mw / Mn=1.46
Mz=35200
P-23
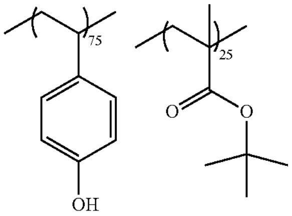
Mw=20800
Mw / Mn=1.46
Mz=35200
-continued
P-24
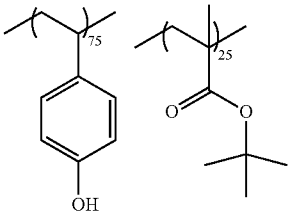
Mw=21000
Mw / Mn=1.41
Mz=35200
P-25
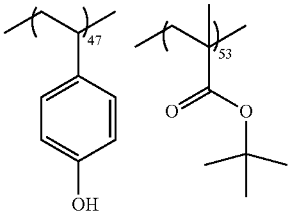
Mw=21000
Mw / Mn=1.46
Mz=35200
P-26
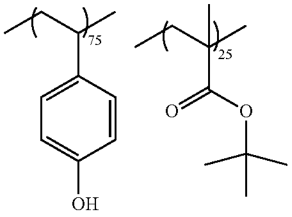
Mw=26000
Mw / Mn=1.48
Mz=35200
P-27
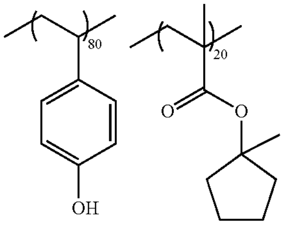
Mw=22000
Mw / Mn=1.53
Mz=37000
<Photoacid Generator (C)>
The structures of the compounds used as the photoacid generator are shown below.
PAG-A
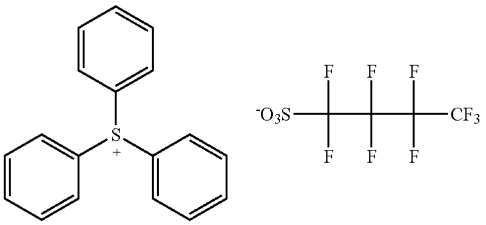
PAG-B
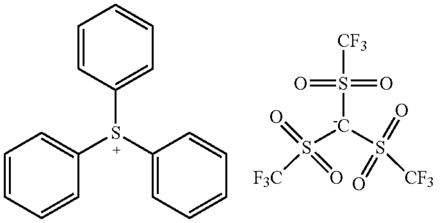

-continued
PAG-C
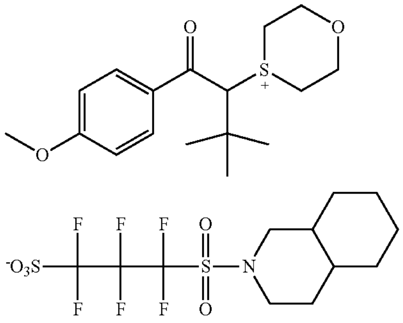
PAG-D
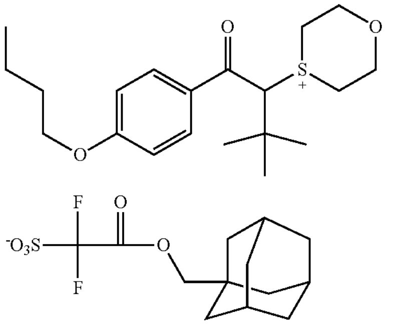
PAG-E
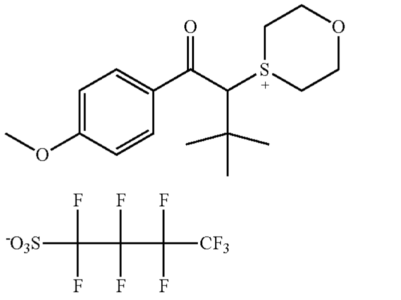
PAG-F
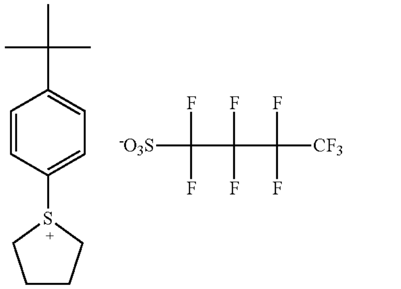
PAG-G
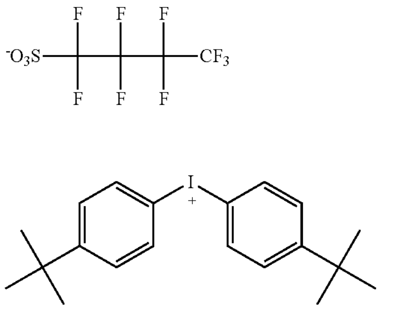
<Acid Diffusion Control Agent (D)>
The structures of the compounds used as the acid diffusion control agent are shown below.
Q-A
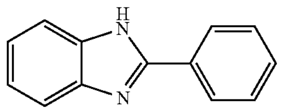
Q-B
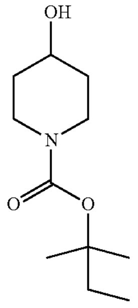
Q-C
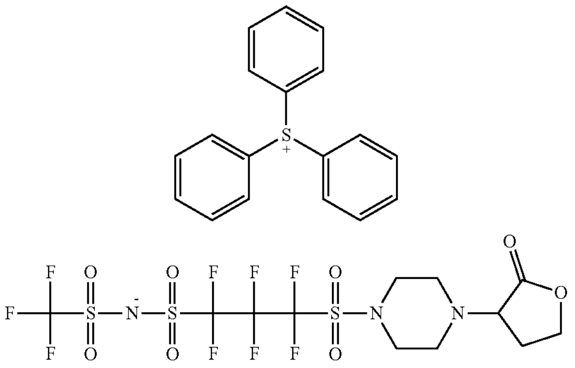
Q-D
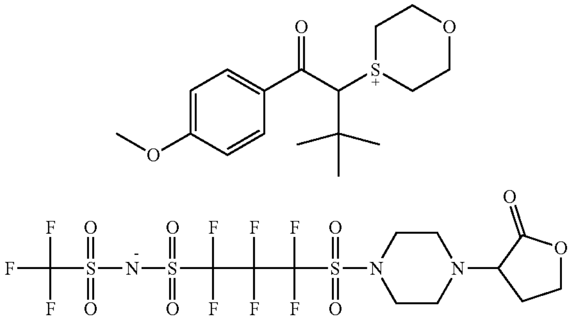
Q-E
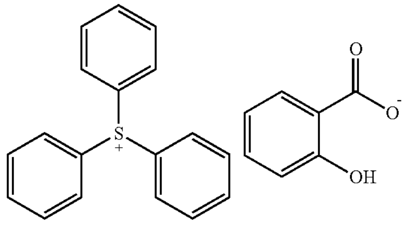

-continued

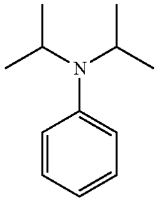

Q-F

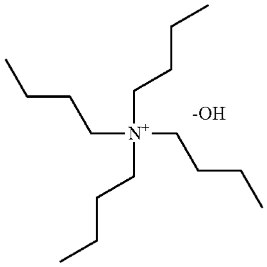

Q-G

<Surfactant (E)>

The following E-X and E-Y were used as the surfactant.

E-X: MEGAFACE (registered trademark) R-41 (manufactured by DIC Corporation)

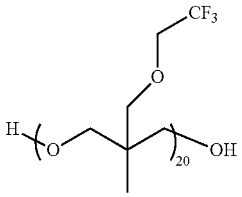

E-Y

<Solvent (S)>

The solvents used are shown below.

PGMEA: Propylene glycol monomethyl ether acetate

PGME: Propylene glycol monomethyl ether

CyHx: Cyclohexanone

<Preparation of Resist Composition>

The resin (A), the resin (B), the photoacid generator (C), the acid diffusion control agent (D), the surfactant (E), and the solvent (S) shown in Tables 1 and 2 below were put into a stirring tank with a volume of 100 L. The contents in the stirring tank were stirred for 12 hours under the condition of 23° C. and 150 rotations per minute (rpm). Next, the accommodated material (solution) after stirring was passed through a filter made of a polyethylene film having a pore size of 0.10 μm to prepare an actinic ray-sensitive or radiation-sensitive resin composition (resist composition).

The content ratio of each component in Tables 1 and 2 is a mass-based proportion of each resist composition to the total solid content. "%" is based on a mass (that is, "% by mass"). The concentration of solid contents means a mass percentage of the mass of other components excluding the solvent with respect to the total mass of each resist composition.

As the solvent (S), the compounds shown in Tables 1 and 2 were used in the mass ratios shown in Tables 1 and 2, respectively.

In Example 6, two kinds of compounds were used as the resin (B) at the mass ratios shown in Table 1. In Examples 11 and 18, two kinds of compounds were used as the photoacid generator (C) at the mass ratios shown in Tables 1 and 2. In Example 17, two kinds of compounds were used as the acid diffusion control agent (D) in the mass ratios shown in Table 2.

TABLE 1

| | Resist | Resin (A) | | Resin (B) | |
|---|---|---|---|---|---|
| | composition | Name | Content | Name | Content |
| Example 1 | R1 | P-1 | 49.05% | P-2 | 49.05% |
| Example 2 | R2 | P-1 | 19.62% | P-2 | 78.48% |
| Example 3 | R3 | P-1 | 78.48% | P-2 | 19.62% |
| Example 4 | R4 | P-1 | 49.05% | P-3 | 49.05% |
| Example 5 | R5 | P-1 | 49.05% | P-4 | 49.05% |
| Example 6 | R6 | P-1 | 49.05% | P-2/50%<br>P-3/50% | 49.05% |
| Example 7 | R7 | P-1 | 49.05% | P-5 | 49.05% |
| Example 8 | R8 | P-1 | 49.05% | P-2 | 49.05% |
| Example 9 | R9 | P-1 | 49.05% | P-2 | 49.05% |
| Example 10 | R10 | P-1 | 49.05% | P-2 | 49.05% |
| Example 11 | R11 | P-6 | 49.05% | P-7 | 49.05% |
| Example 12 | R12 | P-8 | 49.05% | P-9 | 49.05% |
| Example 13 | R13 | P-10 | 49.05% | P-11 | 49.05% |
| Example 14 | R14 | P-12 | 49.05% | P-13 | 49.05% |
| Example 15 | R15 | P-14 | 49.05% | P-15 | 49.05% |

| | Resist | Photoacid generator (C) | | Acid diffusion control agent (D) | |
|---|---|---|---|---|---|
| | composition | Name | Content | Name | Content |
| Example 1 | R1 | PAG-A | 1.50% | Q-A | 0.30% |
| Example 2 | R2 | PAG-A | 1.50% | Q-A | 0.30% |
| Example 3 | R3 | PAG-A | 1.50% | Q-A | 0.30% |
| Example 4 | R4 | PAG-A | 1.50% | Q-A | 0.30% |
| Example 5 | R5 | PAG-A | 1.50% | Q-A | 0.30% |

TABLE 1-continued

| | | | | | |
|---|---|---|---|---|---|
| Example 6 | R6 | PAG-A | 1.50% | Q-A | 0.30% |
| Example 7 | R7 | PAG-A | 1.50% | Q-A | 0.30% |
| Example 8 | R8 | PAG-F | 1.50% | Q-F | 0.30% |
| Example 9 | R9 | PAG-G | 1.50% | Q-G | 0.30% |
| Example 10 | R10 | PAG-A | 1.50% | Q-E | 0.30% |
| Example 11 | R11 | PAG-A/50% PAG-B/50% | 1.50% | Q-C | 0.30% |
| Example 12 | R12 | PAG-B | 1.50% | Q-A | 0.30% |
| Example 13 | R13 | PAG-C | 1.50% | Q-B | 0.30% |
| Example 14 | R14 | PAG-C | 1.50% | Q-B | 0.30% |
| Example 15 | R15 | PAG-C | 1.50% | Q-B | 0.30% |

| | Resist | Surfactant (E) | | | Concentration of |
|---|---|---|---|---|---|
| | composition | Name | Content | Solvent (S) | solid contents |
| Example 1 | R1 | E-X | 0.10% | PGMEA/80% PGME/20% | 23.0% |
| Example 2 | R2 | E-X | 0.10% | PGMEA/80% PGME/20% | 23.0% |
| Example 3 | R3 | E-X | 0.10% | PGMEA/80% PGME/20% | 23.0% |
| Example 4 | R4 | E-X | 0.10% | PGMEA/80% PGME/20% | 23.0% |
| Example 5 | R5 | E-X | 0.10% | PGMEA/80% PGME/20% | 23.0% |
| Example 6 | R6 | E-X | 0.10% | PGMEA/80% PGME/20% | 23.0% |
| Example 7 | R7 | E-X | 0.10% | PGMEA/80% PGME/20% | 23.0% |
| Example 8 | R8 | E-Y | 0.10% | PGMEA/80% PGME/20% | 23.0% |
| Example 9 | R9 | E-Y | 0.10% | PGMEA/80% PGME/20% | 23.0% |
| Example 10 | R10 | E-X | 0.10% | PGMEA/80% PGME/20% | 5.0% |
| Example 11 | R11 | E-X | 0.10% | PGMEA/80% PGME/20% | 23.0% |
| Example 12 | R12 | E-X | 0.10% | PGMEA/80% PGME/20% | 23.0% |
| Example 13 | R13 | E-X | 0.10% | PGMEA/80% PGME/20% | 23.0% |
| Example 14 | R14 | E-X | 0.10% | PGMEA/80% PGME/20% | 23.0% |
| Example 15 | R15 | E-X | 0.10% | PGMEA/80% PGME/20% | 23.0% |

TABLE 2

| | Resist | Resin (A) | | Resin (B) | |
|---|---|---|---|---|---|
| | composition | Name | Content | Name | Content |
| Example 16 | R16 | P-16 | 49.05% | P-17 | 49.05% |
| Example 17 | R17 | P-14 | 49.05% | P-17 | 49.05% |
| Example 18 | R18 | P-18 | 46.10% | P-19 | 46.10% |
| Example 19 | R19 | P-20 | 46.55% | P-21 | 46.55% |
| Comparative Example 1 | RX1 | P-1 | 98.10% | — | 0.00% |
| Comparative Example 2 | RX2 | P-2 | 98.10% | — | 0.00% |
| Comparative Example 3 | RX3 | P-1 | 93.20% | P-2 | 4.91% |
| Comparative Example 4 | RX4 | P-1 | 4.91% | P-2 | 93.20% |
| Comparative Example 5 | RX5 | P-1 | 49.05% | P-22 | 49.05% |
| Comparative Example 6 | RX6 | P-1 | 49.05% | P-23 | 49.05% |
| Comparative Example 7 | RX7 | P-1 | 49.05% | P-24 | 49.05% |
| Comparative Example 8 | RX8 | P-1 | 49.05% | P-25 | 49.05% |

TABLE 2-continued

| | | | | | |
|---|---|---|---|---|---|
| Comparative Example 9 | RX9 | P-1 | 49.05% | P-26 | 49.05% |
| Comparative Example 10 | RX10 | P-1 | 49.05% | P-27 | 49.05% |

| | Resist | Photoacid generator (C) | | Acid diffusion control agent (D) | |
|---|---|---|---|---|---|
| | composition | Name | Content | Name | Content |
| Example 16 | R16 | PAG-D | 1.50% | Q-B | 0.30% |
| Example 17 | R17 | PAG-C | 1.50% | Q-D/50% Q-B/50% | 0.30% |
| Example 18 | R18 | PAG-A/50% PAG-E/50% | 6.50% | Q-A | 1.20% |
| Example 19 | R19 | PAG-C | 6.50% | Q-D | 0.30% |
| Comparative Example 1 | RX1 | PAG-A | 1.50% | Q-A | 0.30% |
| Comparative Example 2 | RX2 | PAG-A | 1.50% | Q-A | 0.30% |
| Comparative Example 3 | RX3 | PAG-A | 1.50% | Q-A | 0.30% |
| Comparative Example 4 | RX4 | PAG-A | 1.50% | Q-A | 0.30% |
| Comparative Example 5 | RX5 | PAG-A | 1.50% | Q-A | 0.30% |
| Comparative Example 6 | RX6 | PAG-A | 1.50% | Q-A | 0.30% |
| Comparative Example 7 | RX7 | PAG-A | 1.50% | Q-A | 0.30% |
| Comparative Example 8 | RX8 | PAG-A | 1.50% | Q-A | 0.30% |
| Comparative Example 9 | RX9 | PAG-A | 1.50% | Q-A | 0.30% |
| Comparative Example 10 | RX10 | PAG-A | 1.50% | Q-A | 0.30% |

| | Resist | Surfactant (E) | | | Concentration of |
|---|---|---|---|---|---|
| | composition | Name | Content | Solvent (S) | solid contents |
| Example 16 | R16 | E-X | 0.10% | PGMEA/80% PGME/20% | 23.0% |
| Example 17 | R17 | E-X | 0.10% | PGMEA/80% PGME/20% | 23.0% |
| Example 18 | R18 | E-X | 0.10% | PGMEA/80% PGME/20% | 15.0% |
| Example 19 | R19 | E-X | 0.10% | PGMEA/70% CyHx/30% | 15.0% |
| Comparative Example 1 | RX1 | E-X | 0.10% | PGMEA/80% PGME/20% | 23.0% |
| Comparative Example 2 | RX2 | E-X | 0.10% | PGMEA/80% PGME/20% | 23.0% |
| Comparative Example 3 | RX3 | E-X | 0.10% | PGMEA/80% PGME/20% | 23.0% |
| Comparative Example 4 | RX4 | E-X | 0.10% | PGMEA/80% PGME/20% | 23.0% |
| Comparative Example 5 | RX5 | E-X | 0.10% | PGMEA/80% PGME/20% | 23.0% |
| Comparative Example 6 | RX6 | E-X | 0.10% | PGMEA/80% PGME/20% | 23.0% |
| Comparative Example 7 | RX7 | E-X | 0.10% | PGMEA/80% PGME/20% | 23.0% |
| Comparative Example 8 | RX8 | E-X | 0.10% | PGMEA/80% PGME/20% | 23.0% |
| Comparative Example 9 | RX9 | E-X | 0.10% | PGMEA/80% PGME/20% | 23.0% |
| Comparative Example 10 | RX10 | E-X | 0.10% | PGMEA/80% PGME/20% | 23.0% |

$|G_A-G_B|$ for the resin (A) and the resin (B) included in each resist composition, whether the structures of the acid-decomposable groups are the same or different, $S_A/S_B$, $|Mw_A-Mw_B|$, $|Mw_A/Mn_A-Mw_B/Mn_B|$, and $|Mz_A-Mz_B|$ are shown in Table 3 below. In addition, the viscosity of each resist composition is also shown in Table 3 below. The viscosity was measured using an E-type viscometer (RE-85L type, manufactured by Toki Sangyo Co., Ltd.) under the condition of 25° C.

$|G_A-G_B|$ is the absolute value of a difference between a mole-based content ratio $G_A$ of the repeating unit having an acid-decomposable group in the resin (A) and a mole-based content ratio $G_B$ of the repeating unit having an acid-decomposable group in the resin (B).

$S_A/S_B$ is the ratio of a mass-based content ratio $S_A$ of the resin (A) to the total solid content in the resist composition to a mass-based content ratio $S_B$ of the resin (B) to the total solid content in the resist composition.

$|Mw_A-Mw_B|$ is the absolute value of a difference between a weight-average molecular weight $Mw_A$ of the resin (A) and a weight-average molecular weight $Mw_B$ of the resin (B).

$|Mw_A/Mn_A-Mw_B/Mn_B|$ is the absolute value of a difference between a molecular weight distribution $Mw_A/Mn_A$ of the resin (A), which is a value $Mw_A/Mn_A$ obtained by dividing $Mw_A$ by a number-average molecular weight $Mn_A$, and a molecular weight distribution $Mw_B/Mn_B$ of the resin (B), which is a value $Mw_B/Mn_B$ obtained by dividing $Mw_B$ by a number-average molecular weight $Mn_B$.

$|Mz_A-Mz_B|$ is the absolute value of a difference between a Z-average molecular weight $Mz_A$ of the resin (A) and a Z-average molecular weight $Mz_B$ of the resin (B).

TABLE 3

| | Resist composition | $\lvert G_A - G_B\rvert$ (% by mole) | Structures of acid-decomposable groups of resin (A) vs. resin (B) |
|---|---|---|---|
| Example 1 | R1 | 10 | Same |
| Example 2 | R2 | 10 | Same |
| Example 3 | R3 | 10 | Same |
| Example 4 | R4 | 6 | Same |
| Example 5 | R5 | 10 | Same |
| Example 6 | R6 | 8 | Same |
| Example 7 | R7 | 20 | Same |
| Example 8 | R8 | 10 | Same |
| Example 9 | R9 | 10 | Same |
| Example 10 | R10 | 10 | Same |
| Example 11 | R11 | 5 | Same |
| Example 12 | R12 | 15 | Same |
| Example 13 | R13 | 5 | Same |
| Example 14 | R14 | 5 | Same |
| Example 15 | R15 | 10 | Same |
| Example 16 | R16 | 20 | Same |
| Example 17 | R17 | 15 | Same |
| Example 18 | R18 | 10 | Same |
| Example 19 | R19 | 5 | Same |
| Comparative Example 1 | RX1 | — | — |
| Comparative Example 2 | RX2 | — | — |
| Comparative Example 3 | RX3 | 10 | Same |
| Comparative Example 4 | RX4 | 10 | Same |
| Comparative Example 5 | RX5 | 2 | Same |
| Comparative Example 6 | RX6 | 5 | Same |
| Comparative Example 7 | RX7 | 5 | Same |
| Comparative Example 8 | RX8 | 23 | Same |
| Comparative Example 9 | RX9 | 5 | Same |
| Comparative Example 10 | RX10 | 10 | Different |

| | Resist composition | $S_A/S_B$ | $\lvert Mw_A - Mw_B\rvert$ | $\lvert Mw_A/Mn - Mw_B/Mn_B\rvert$ | $\lvert Mz_A - Mz_B\rvert$ | Viscosity (mPa · s) |
|---|---|---|---|---|---|---|
| Example 1 | R1 | 50/50 | 1,200 | 0.12 | 2,000 | 60 |
| Example 2 | R2 | 20/80 | 1,200 | 0.12 | 2,000 | 60 |
| Example 3 | R3 | 80/20 | 1,200 | 0.12 | 2,000 | 60 |
| Example 4 | R4 | 50/50 | 200 | 0.05 | 0 | 60 |
| Example 5 | R5 | 50/50 | 100 | 0.06 | 500 | 60 |
| Example 6 | R6 | 50/50 | 700 | 0.09 | 1,000 | 60 |
| Example 7 | R7 | 50/50 | 4,700 | 0.05 | 500 | 60 |
| Example 8 | R8 | 50/50 | 1,200 | 0.12 | 2,000 | 60 |
| Example 9 | R9 | 50/50 | 1,200 | 0.12 | 2,000 | 60 |
| Example 10 | R10 | 50/50 | 1,200 | 0.12 | 2,000 | 2 |
| Example 11 | R11 | 50/50 | 400 | 0.30 | 0 | 60 |
| Example 12 | R12 | 50/50 | 500 | 0.07 | 500 | 40 |
| Example 13 | R13 | 50/50 | 500 | 0.05 | 1,000 | 60 |
| Example 14 | R14 | 50/50 | 500 | 0.05 | 1,000 | 60 |
| Example 15 | R15 | 50/50 | 500 | 0.05 | 1,000 | 60 |
| Example 16 | R16 | 50/50 | 500 | 0.05 | 1,000 | 60 |
| Example 17 | R17 | 50/50 | 500 | 0.05 | 1,000 | 60 |
| Example 18 | R18 | 50/50 | 1,000 | 0.08 | 2,000 | 15 |
| Example 19 | R19 | 50/50 | 300 | 0.10 | 0 | 15 |
| Comparative Example 1 | RX1 | — | — | — | — | 60 |
| Comparative Example 2 | RX2 | — | — | — | — | 60 |
| Comparative Example 3 | RX3 | 95/5 | 1,200 | 0.12 | 2,000 | 60 |
| Comparative Example 4 | RX4 | 5/95 | 1,200 | 0.12 | 2,000 | 60 |
| Comparative Example 5 | RX5 | 50/50 | 200 | 0.05 | 200 | 60 |

TABLE 3-continued

| | | | | | | |
|---|---|---|---|---|---|---|
| Comparative Example 6 | RX6 | 50/50 | 0 | 0.05 | 200 | 60 |
| Comparative Example 7 | RX7 | 50/50 | 200 | 0.00 | 200 | 60 |
| Comparative Example 8 | RX8 | 50/50 | 200 | 0.05 | 200 | 60 |
| Comparative Example 9 | RX9 | 50/50 | 5,200 | 0.07 | 200 | 60 |
| Comparative Example 10 | RX10 | 50/50 | 1,200 | 0.12 | 2,000 | 60 |

<Pattern Formation>

The resist composition shown in Table 4 below was spin-coated on an Si substrate (manufactured by Advanced Materials Technology), which had been subjected to a hexamethyldisilazane treatment, at a rotation speed of 1,500 rpm without providing an antireflection layer, and prebaked (PB) at a temperature of 120° C. for 60 seconds to form an actinic ray-sensitive or radiation-sensitive film (resist film). The film thickness of the resist film was the thickness shown in Table 4 below. The wafer on which the resist film had been formed was subjected to pattern exposure at 225 points on the wafer through an exposure mask, using a KrF excimer laser scanner (manufactured by ASML, PAS5500/850C, wavelength 248 nm, NA0.50) in Examples 1 to 18 and Comparative Examples 1 to 10, and an ArF excimer laser scanner (manufactured by ASML, PAS5500/1100, wavelength 193 nm, NA 0.50) in Example 19. Then, the product was baked (post exposure bake; PEB) at a temperature of 110° C. for 60 seconds, developed with a developer shown in Table 4 below for 60 seconds, then rinsed with a rinsing liquid shown in Table 4 below for 30 seconds, and spin-dried. As a result, a wafer in which 225 patterns for evaluation (line-and-space patterns having a pitch of 700 nm and a space width of 300 nm) were formed in a plane was obtained.

In Table 4, "TMAHaq" is an aqueous tetramethylammonium hydroxide solution (concentration: 2.38% by mass), "nBA" is butyl acetate, and "MIBC" is methylisobutylcarbinol (4-methyl-2-pentanol).

<Evaluation of CDU>

A 225-point pattern for evaluation (line-and-space pattern having a pitch of 700 nm and a space width of 300 nm) was measured for CD (space width size) using a scanning electron microscope (SEM) (S-9380II, manufactured by Hitachi, Ltd.). A standard deviation was obtained from the obtained CD value, 3σ was calculated, and the value (unit: nm) was used as an index of the CDU. The smaller this value, the smaller the variation in dimensions, and the better the CDU.

TABLE 4

| | Resist composition | Film thickness of resist film (μm) | Light source for exposure | Develope | Rinsing liquid | CDU (nm) |
|---|---|---|---|---|---|---|
| Example 1 | R1 | 3.3 | KrF | TMAHaq | Pure water | 4.4 |
| Example 2 | R2 | 3.3 | KrF | TMAHaq | Pure water | 4.6 |
| Example 3 | R3 | 3.3 | KrF | TMAHaq | Pure water | 4.7 |
| Example 4 | R4 | 3.3 | KrF | TMAHaq | Pure water | 7.4 |
| Example 5 | R5 | 3.3 | KrF | TMAHaq | Pure water | 5.6 |
| Example 6 | R6 | 3.3 | KrF | TMAHaq | Pure water | 5.1 |
| Example 7 | R7 | 3.3 | KrF | TMAHaq | Pure water | 5.1 |
| Example 8 | R8 | 3.3 | KrF | TMAHaq | Pure water | 4.3 |
| Example 9 | R9 | 3.3 | KrF | TMAHaq | Pure water | 4.3 |
| Example 10 | R10 | 0.2 | KrF | TMAHaq | Pure water | 4.6 |
| Example 11 | R11 | 3.3 | KrF | TMAHaq | Pure water | 7.5 |
| Example 12 | R12 | 3.3 | KrF | TMAHaq | Pure water | 7.5 |
| Example 13 | R13 | 3.3 | KrF | TMAHaq | Pure water | 5.5 |
| Example 14 | R14 | 3.3 | KrF | TMAHaq | Pure water | 5.5 |
| Example 15 | R15 | 3.3 | KrF | TMAHaq | Pure water | 5.0 |
| Example 16 | R16 | 3.3 | KrF | TMAHaq | Pure water | 5.0 |
| Example 17 | R17 | 3.3 | KrF | TMAHaq | Pure water | 5.0 |
| Example 18 | R18 | 1.0 | KrF | nBA | MIBC | 5.1 |
| Example 19 | R19 | 1.0 | ArF | TMAHaq | Pure water | 7.6 |
| Comparative Example 1 | RX1 | 3.3 | KrF | TMAHaq | Pure water | 18.4 |
| Comparative Example 2 | RX2 | 3.3 | KrF | TMAHaq | Pure water | 20.8 |
| Comparative Example 3 | RX3 | 3.3 | KrF | TMAHaq | Pure water | 17.4 |
| Comparative Example 4 | RX4 | 3.3 | KrF | TMAHaq | Pure water | 19.1 |
| Comparative Example 5 | RX5 | 3.3 | KrF | TMAHaq | Pure water | 15.4 |
| Comparative Example 6 | RX6 | 3.3 | KrF | TMAHaq | Pure water | 16.3 |
| Comparative Example 7 | RX7 | 3.3 | KrF | TMAHaq | Pure water | 14.9 |
| Comparative Example 8 | RX8 | 3.3 | KrF | TMAHaq | Pure water | 15.9 |

TABLE 4-continued

| | Resist composition | Film thickness of resist film (μm) | Light source for exposure | Develope | Rinsing liquid | CDU (nm) |
|---|---|---|---|---|---|---|
| Comparative Example 9 | RX9 | 3.3 | KrF | TMAHaq | Pure water | 14.9 |
| Comparative Example 10 | RX10 | 3.3 | KrF | TMAHaq | Pure water | 14.2 |

As can be seen from Table 4, the resist compositions of Examples were capable of forming a pattern having an excellent CDU.

According to the present invention, it is possible to provide an actinic ray-sensitive or radiation-sensitive resin composition capable of forming a pattern having an excellent CDU, and a resist film, a pattern forming method, and a method for manufacturing an electronic device, each using the actinic ray-sensitive or radiation-sensitive resin composition.

Although the present invention has been described in detail with reference to specific embodiments, it will be apparent to those skilled in the art that various changes and modifications can be made without departing from the spirit and the scope of the present invention.

What is claimed is:

1. An actinic ray-sensitive or radiation-sensitive resin composition comprising:

a resin (A) including a repeating unit having an acid-decomposable group; and a resin (B) including a repeating unit having an acid-decomposable group, wherein an absolute value $|G_A-G_B|$ of a difference between a mole-based content ratio $G_A$ of the repeating unit having an acid-decomposable group in the resin (A) and a mole-based content ratio $G_B$ of the repeating unit having an acid-decomposable group in the resin (B) is from 5% by mole to 20% by mole, the acid-decomposable group in the resin (A) and the acid-decomposable group in the resin (B) have the same structures, a ratio $S_A/S_B$ between a mass-based content ratio $S_A$ of the resin (A) to a mass-based content ratio $S_B$ of the resin (B) with respect to a total solid content in the actinic ray-sensitive or radiation-sensitive resin composition is 10/90 to 90/10, an absolute value $|Mw_A-Mw_B|$ of a difference between a weight-average molecular weight $Mw_A$ of the resin (A) and a weight-average molecular weight $Mw_B$ of the resin (B) is from 1,000 to 5,000, an absolute value $|Mw_A/Mn_A-Mw_B/Mn_B|$ of a difference between a molecular weight distribution $Mw_A/Mn_A$ of the resin (A), which is a value obtained by dividing $Mw_A$ by a number-average molecular weight $Mn_A$ of the resin (A), and a molecular weight distribution $Mw_B/Mn_B$ of the resin (B), which is a value obtained by dividing $Mw_B$ by a number-average molecular weight $Mn_B$ of the resin (B), is 0.05 or more, and the repeating unit having an acid-decomposable group included in the resin (A) and the resin (B) is represented by General Formula (Aa2), (Aa2)

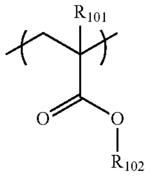

in General Formula (Aa2), $R_{101}$ represents a hydrogen atom, a fluorine atom, an iodine atom, an alkyl group, or an aryl group, and $R_{102}$ represents a group that leaves by an action of an acid.

2. The actinic ray-sensitive or radiation-sensitive resin composition according to claim 1, wherein $S_A/S_B$ is 40/60 to 60/40.

3. The actinic ray-sensitive or radiation-sensitive resin composition according to claim 1, wherein a viscosity at 25° C. is 10 to 100 mPa·s.

4. The actinic ray-sensitive or radiation-sensitive resin composition according to claim 1, wherein $|G_A-G_B|$ is from 10% by mole to 20% by mole.

5. The actinic ray-sensitive or radiation-sensitive resin composition according to claim 1, wherein $G_A$ is 30% by mole or less.

6. The actinic ray-sensitive or radiation-sensitive resin composition according to claim 1, wherein $|Mw_A/Mn_A-Mw_B/Mn_B|$ is 0.10 or more.

7. The actinic ray-sensitive or radiation-sensitive resin composition according to claim 1, wherein an absolute value $|Mz_A-Mz_B|$ of a difference between a Z-average molecular weight $Mz_A$ of the resin (A) and a Z-average molecular weight $Mz_B$ of the resin (B) is 100 or more.

8. The actinic ray-sensitive or radiation-sensitive resin composition according to claim 7, wherein $|Mz_A-Mz_B|$ is 1,000 or more.

9. A resist film formed of the actinic ray-sensitive or radiation-sensitive resin composition according to claim 1.

10. A pattern forming method comprising:

forming a resist film on a substrate using the actinic ray-sensitive or radiation-sensitive resin composition according to claim 1;

exposing the resist film to obtain an exposed resist film; and developing the exposed resist film using a developer to form a pattern.

11. The pattern forming method according to claim 10, wherein a light source for the exposure is KrF.

12. The pattern forming method according to claim 10, wherein a thickness of the resist film formed on the substrate is 500 nm or more.

13. A method for manufacturing an electronic device, comprising the pattern forming method according to claim 10.

* * * * *